United States Patent
Lin et al.

(10) Patent No.: US 7,504,872 B2
(45) Date of Patent: Mar. 17, 2009

(54) GENERIC FLEXIBLE TIMER DESIGN

(75) Inventors: Hwong-Kwo Lin, Palo Alto, CA (US); Ge Yang, Pleasanton, CA (US); Ethan A. Frazier, Sunnyvale, CA (US); Charles Chew-Yuen Young, Cupertino, CA (US)

(73) Assignee: NVIDIA Corporation, Santa Clara, CA (US)

(*) Notice: Subject to any disclaimer, the term of this patent is extended or adjusted under 35 U.S.C. 154(b) by 0 days.

(21) Appl. No.: 11/838,171

(22) Filed: Aug. 13, 2007

(65) Prior Publication Data
US 2009/0045847 A1    Feb. 19, 2009

(51) Int. Cl.
*H03H 11/26* (2006.01)
*G06F 7/38* (2006.01)
*H03K 19/173* (2006.01)

(52) U.S. Cl. .................. 327/276; 326/38; 327/269; 327/270; 327/277; 327/281; 327/261

(58) Field of Classification Search ............ 327/276
See application file for complete search history.

(56) References Cited

U.S. PATENT DOCUMENTS

| 4,878,198 | A | 10/1989 | Roy |
| 5,018,106 | A | 5/1991 | Ul Haq et al. |
| 6,335,873 | B1 | 1/2002 | Kawaguchi et al. |
| 6,563,730 | B1 | 5/2003 | Poplevine et al. |
| 6,885,231 | B2 * | 4/2005 | Kuppuswamy et al. ..... 327/276 |
| 7,119,596 | B2 * | 10/2006 | Kong et al. ................. 327/261 |

* cited by examiner

*Primary Examiner*—Rexford Barnie
*Assistant Examiner*—Matthew C Tabler
(74) *Attorney, Agent, or Firm*—Patterson & Sheridan, LLP

(57) ABSTRACT

One embodiment of the present invention sets forth a set of three building block circuits for designing a flexible timing generator for an integrated circuit. The first and second building blocks include delay elements that may be customized and fine-tuned prior to fabrication. The third building block may be tuned prior to fabrication as well as after fabrication. The three building blocks may be incorporated into a modular architecture, enabling designers to easily generate well-characterized, flexible, generic timer circuits.

20 Claims, 20 Drawing Sheets

GENERIC FLEXIBLE TIMER DESIGN

BACKGROUND OF THE INVENTION

1. Field of the Invention

Embodiments of the present invention relate generally to integrated timing generators and more specifically to a generic flexible timer design.

2. Description of the Related Art

Integrated circuits frequently employ a timing pulse generator, or "timer," to produce a set of related pulse signals that may be used to coordinate and control activity within the integrated circuit. A timer may have a plurality of clock outputs, where each clock output activates a specific portion of a client circuit within the overall integrated circuit that is being controlled. The timing relationship between the clock outputs is generally important to the proper function of the client circuits.

One particularly challenging type of timer generates multiple pulses within the time span of a single system clock cycle. The pulses are generated in response to an activation event, such as a control signal pulse or clock edge arriving on one or more designated timer input pins. The activation event triggers a sequence of events within the timer that produces the required output pulses. For example, an embedded static random access memory (SRAM) may receive a reference clock signal, as well as read and write enable signals. From an external viewpoint, the SRAM synchronously reads from a specified address or writes to a specified address, according to the reference clock signal and enable signals. Internally, however, the SRAM is generating a carefully staged sequence of timing pulses to activate pre-charge circuits, row and column drivers, sense amplifier circuits, and the like, within the time period of a single synchronous clock cycle. The detailed delay and phase specification for each of the timing pulses is determined based on predictive timing models of the circuits within the SRAM. The SRAM timer circuit is typically designed to meet the specific timing needs of the various client circuits internal to the SRAM.

The design effort associated with custom timer circuits is typically very costly and error prone. Furthermore, the predictive timing models of the client circuits are sometimes wrong or incomplete, causing a malfunction of the overall integrated circuit. The most common solution to such a malfunction is an expensive re-design and re-fabrication of the integrated circuit. This type of solution is increasingly expensive as mask costs continue to increase with each successive process node.

As the foregoing illustrates, what is needed in the art is a technique for designing custom timer circuits that can accommodate various modeling inaccuracies, while minimizing overall design effort and cost.

SUMMARY OF THE INVENTION

One embodiment of the present invention sets forth a generic flexible timer. The timer includes a pin-programmable delay cell that has an input channel through which an input signal is transmitted, a first control input channel through which a first control signal is transmitted for controlling a first transmission gate, a second control input channel through which a second control signal is transmitted for controlling a second transmission gate and a third transmission gate, a first set of delay elements disposed between the input channel and the third transmission gate, where each delay element may be reconfigured with a single interconnect layer change, a second set of delay elements, where each delay element may be reconfigured with a single interconnect layer change, and the first transmission gate, the second transmission gate and the third transmission gate are disposed between the first set of delay elements and the second set of delay elements, an output channel through which an output signal is transmitted, and a buffered output channel through which a buffered output signal is transmitted. The timer also includes at least one fine-tune delay cell coupled to the pin-programmable delay cell, where each fine-tuned delay cell has an input channel through which an input signal is received and transmitted, a first delay element coupled to the input channel, a second delay element coupled to the first delay element, where each of the first delay element and the second delay element may be reconfigured with a single interconnect layer change, an output driver coupled to the second delay element, an output channel through which an output signal is transmitted, and a buffered output channel through which a buffered output signal is transmitted.

One advantage of the disclosed generic flexible timer is that it may be incorporated into a modular architecture, enabling circuit designers to easily generate well-characterized, flexible, generic timer circuits.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

FIGS. 1A to 1E illustrate the circuit design and interconnect configuration for a family of delay elements, according to various embodiments of the invention. Persons skilled in the art will recognize that the physical design used to implement the circuits shown in FIGS. 1A through 1E may be identical except for minimal connectivity differences, preferably within one metal or interconnect layer. Using this characteristic of the delay elements shown in FIGS. 1A through 1E, a designer may change the selected delay element within an integrated circuit using only a predetermined single interconnect layer change.

Figure 1A:
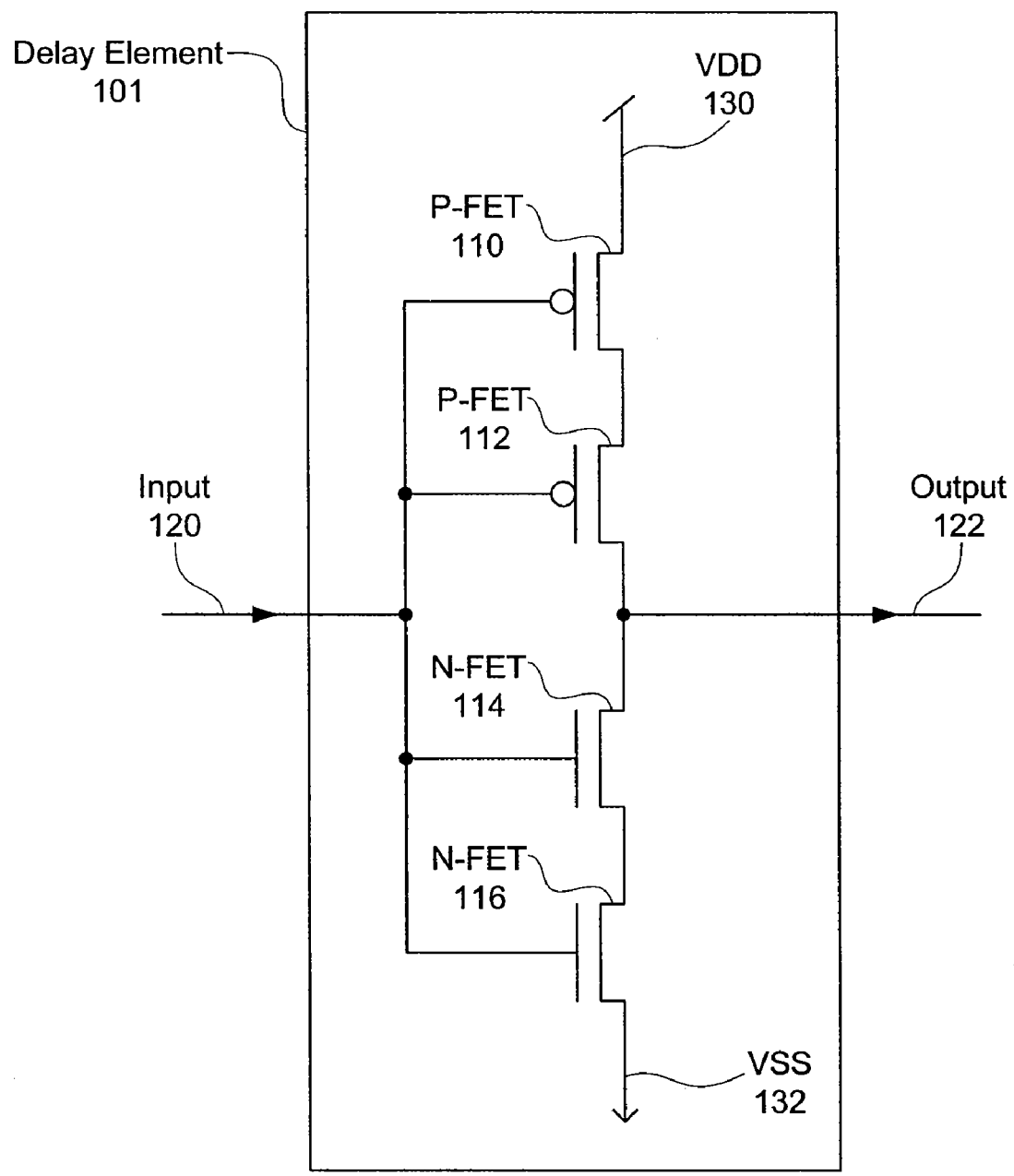
FIGS. 1A to 1E illustrate the circuit design and interconnect configuration for a family of delay elements, according to various embodiments of the invention.

FIG. 1A illustrates a delay element 101 that receives an input logic signal on input node 120 and generates an output logic signal on output node 122 that is a delayed and inverted version of the input signal. The delay element 101 drives the output node 122 with a reference drive strength ("1×"). The delay element 101 includes two p-channel field-effect transistors (P-FETS) 110, 112 and two n-channel field-effect transistors (N-FETS) 114, 116. Current is supplied to the source node of P-FET 110 from a positive supply rail 130, customarily referred to as "VDD." The drain node of P-FET 110 supplies the source node of P-FET 112. The drain node of P-FET 112 connects to the output node 122. The source node of N-FET 116 connects to a negative power rail 132, customarily referred to as "VSS." The drain node of N-FET 116 connects to the source node of N-FET 114. The drain node of N-FET 114 connects to the output node 122. The input signal 120 is connected to the gate nodes of FETS 110, 112, 114 and 116. Persons skilled in the art will recognize that delay element 101 may achieve 1× drive strength through the series connection of two 2×-sized FETS for both pull-up (P-FET) and pull-down (N-NET) output drive.

Figure 1B:
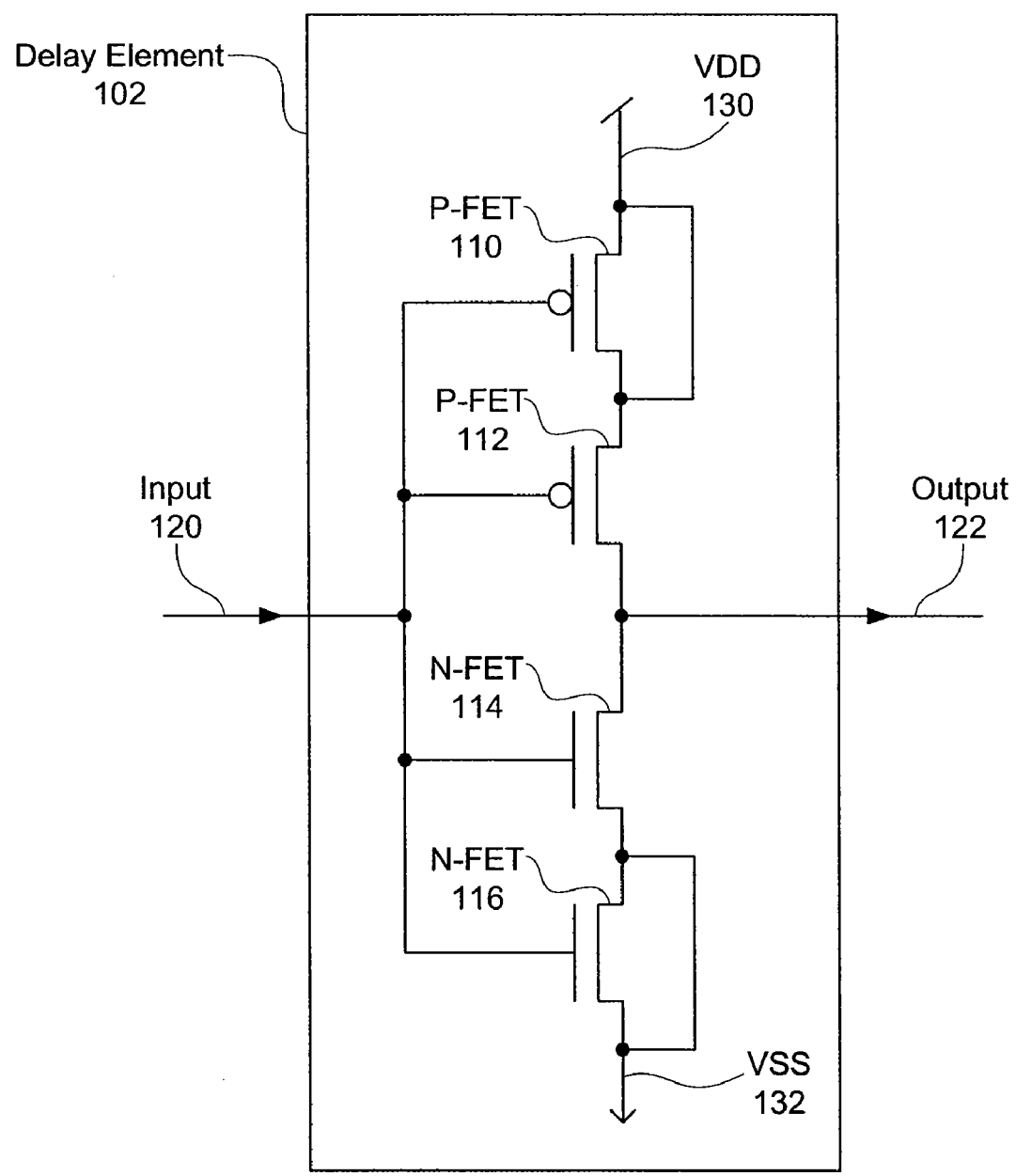

FIG. 1B illustrates a delay element 102 that receives an input logic signal on input node 120 and generates an output logic signal on output node 122 that is a delayed and inverted version of the input signal. The delay element 102 drives the output node 122 with twice the reference drive strength ("2×"). The delay element 102 includes two p-channel field-effect transistors (P-FETS) 110, 112 and two n-channel field-effect transistors (N-FETS) 114, 116. Current is supplied to the source node of P-FET 112 from the VDD node 130 through a bypass interconnect that shorts the source and drain nodes of P-FET 110. The drain node of P-FET 112 connects to the output node 122. The source node of N-FET 114 connects to the VSS node 132 through a bypass interconnect that shorts the source and drain nodes of P-FET 116. The drain node of N-FET 114 connects to the output node 122. The input signal 120 is connected to the gate nodes of FETS 110, 112, 114 and 116. Persons skilled in the art will recognize that delay element 102 may achieve 2× drive strength by bypassing FETS 110 and 116, thereby reducing the pull-up and pull-down resistance by a factor of 2×.

Figure 1C:
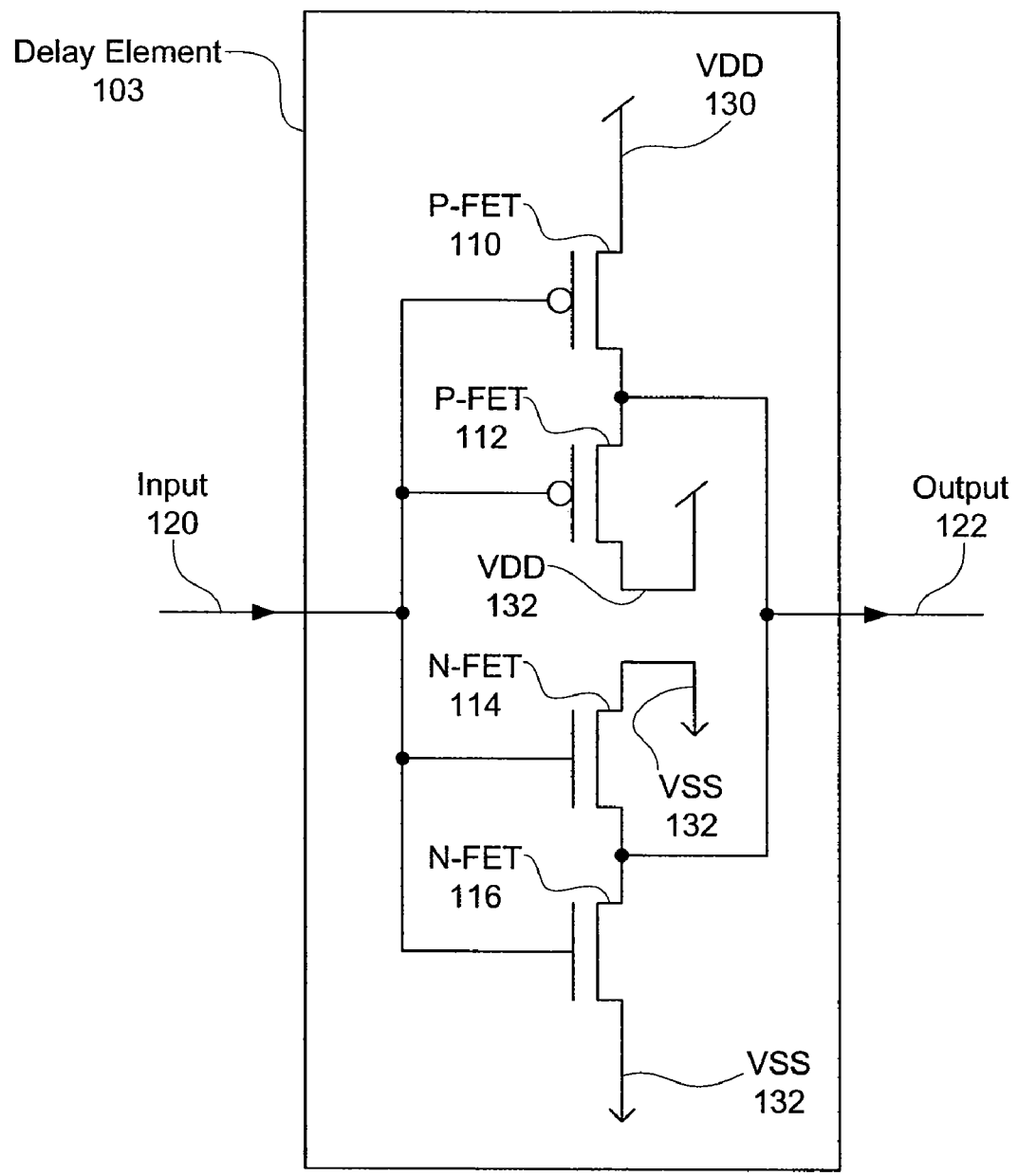

FIG. 1C illustrates a delay element 103 that receives an input logic signal on input node 120 and generates an output logic signal on output node 122 that is a delayed and inverted version of the input signal. The delay element 103 drives the output node 122 with four times the reference drive strength ("4×"). The delay element 103 includes two p-channel field-effect transistors (P-FETS) 110, 112 and two n-channel field-effect transistors (N-FETS) 114, 116. Current is supplied to the source node of P-FETS 110 and 112 from the VDD node 130. The drain nodes of P-FET 110 and 112 connect to the output node 122. The source node of N-FETS 114 and 116 connect to the VSS node 132. The drain nodes of N-FETS 114 and 116 connect to the source node of N-FET 114. The drain nodes of N-FET 114 and 116 connect to the output node 122. The input signal 120 is connected to the gate nodes of FETS 110, 112, 114 and 116. Persons skilled in the art will recognize that delay element 103 may achieve 4× drive strength by operating the two P-FETS 110, 112 and the two N-FETS 114, 116 in parallel.

Figure 1D:
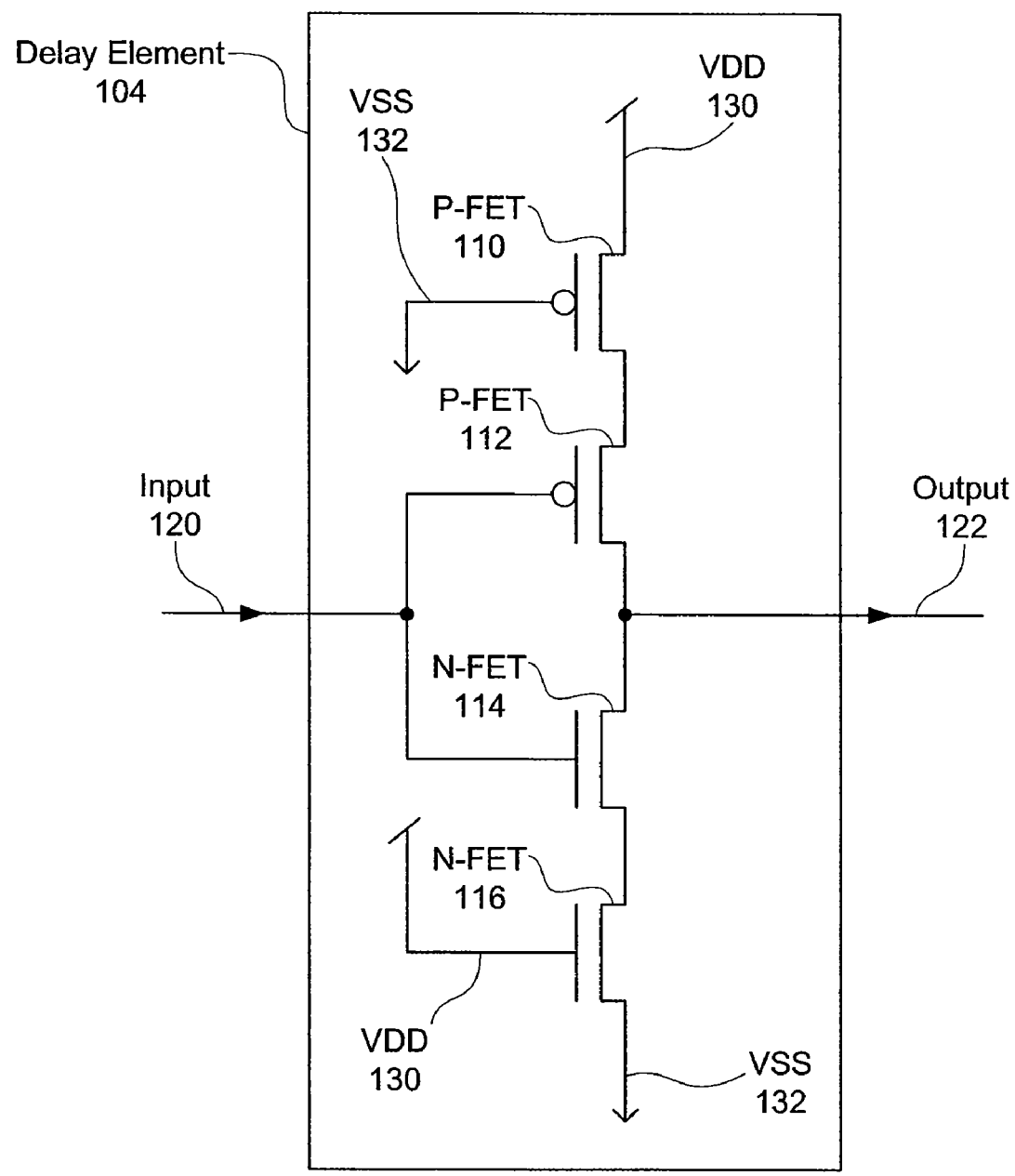

FIG. 1D illustrates a delay element 104 that receives an input logic signal on input node 120 and generates an output logic signal on output node 122 that is a delayed and inverted version of the input signal. The delay element 104 drives the output node 122 with a reference drive strength ("1×"). The delay element 104 includes two p-channel field-effect transistors (P-FETS) 110, 112 and two n-channel field-effect transistors (N-FETS) 114, 116. Current is supplied to the source node of P-FET 110 from the VDD node 130. The drain node of P-FET 110 supplies the source node of P-FET 112. The drain node of P-FET 112 connects to the output node 122. The source node of N-FET 116 connects to the VSS node 132. The drain node of N-FET 116 connects to the source node of N-FET 114. The drain node of N-FET 114 connects to the output node 122. The input signal 120 is connected to the gate nodes of FETS 112 and 114. The gate node of P-FET 110 is connected to the VSS node 132 to permanently turn P-FET 110 "on." The gate node of N-FET 116 is connected to the VDD node to permanently turn P-FET 116 "on." Importantly, the input capacitive load presented on input node 120, due to gate capacitance, is approximately half the input capacitive load of delay elements of FIGS. 1A through 1C.

Figure 1E:
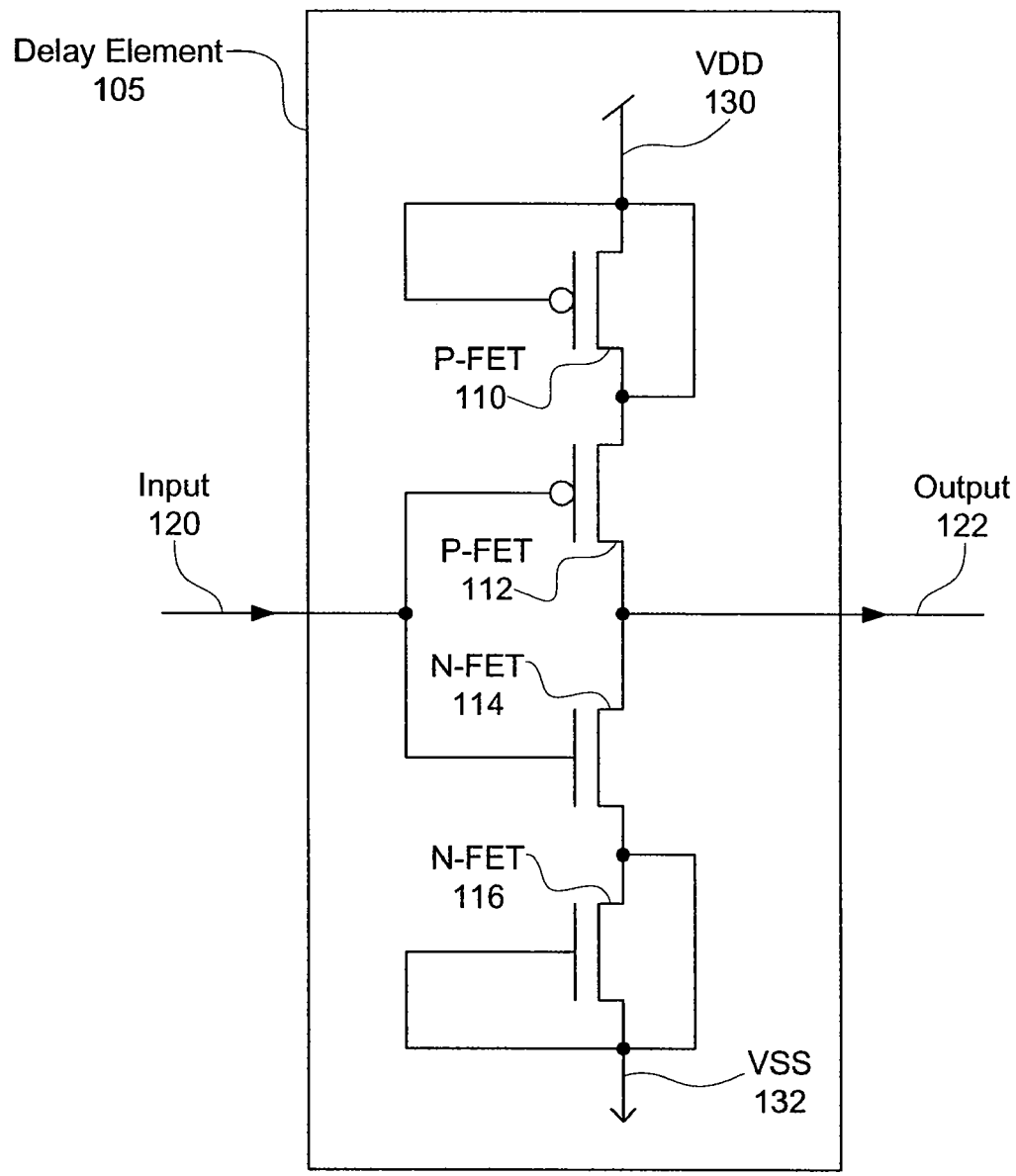

FIG. 1E illustrates a delay element 105 that receives an input logic signal on input node 120 and generates an output logic signal on output node 122 that is a delayed and inverted version of the input signal. The delay element 105 drives the output node 122 with approximately twice the reference drive strength ("2×"). The delay element 105 includes two p-channel field-effect transistors (P-FETS) 110, 112 and two n-channel field-effect transistors (N-FETS) 114, 116. Current is supplied to the source node of P-FET 112 from the VDD node 130 through a bypass interconnect that shorts the source and drain nodes of P-FET 110. The drain node of P-FET 112 connects to the output node 122. The source node of N-FET 114 connects to the VSS node 132 through a bypass interconnect that shorts the source and drain nodes of P-FET 116. The drain node of N-FET 114 connects to the output node 122. The input signal 120 is connected to the gate nodes of FETS 112 and 116. Persons skilled in the art will recognize that delay element 105 may achieve 2× drive strength by bypassing FETS 110 and 116, thereby reducing the pull-up and pull-down resistance by a factor of 2×. Importantly, the input capacitive load presented on input node 120, due to gate capacitance, is approximately half the input capacitive load of delay elements of FIGS. 1A through 1C.

Figure 2:
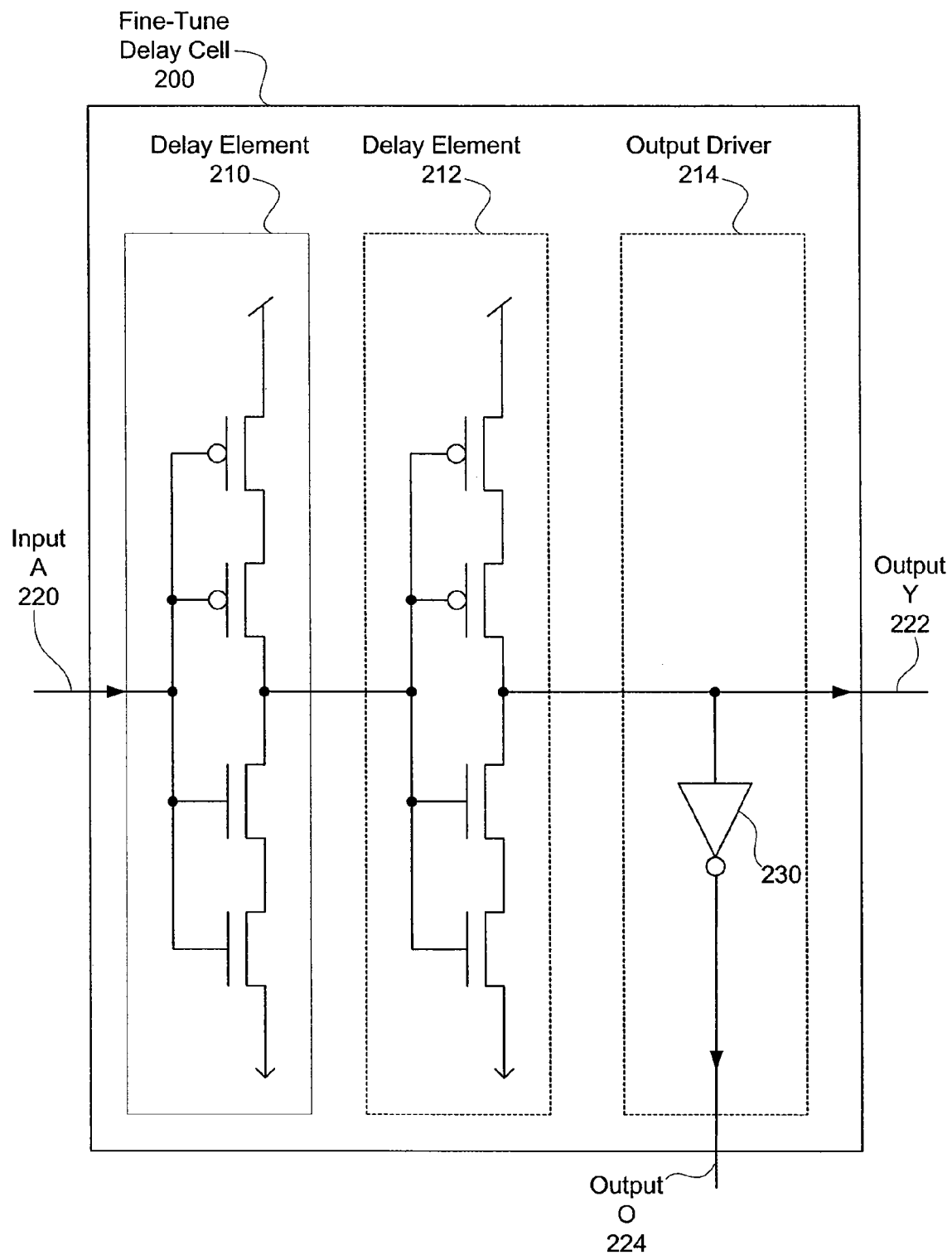
FIG. 2 illustrates the circuit design of a fine-tune delay cell, according to one embodiment of the invention.

FIG. 2 illustrates the circuit design of a fine-tune delay cell 200, according to one embodiment of the invention. The fine-tune delay cell 200 includes sequentially connected delay elements 210 and 212 as well as an output driver 214. The delay elements 210 and 212 may incorporate the configuration of any of the delay elements described in FIGS. 1A through 1E. Input A 220 drives the input of delay element 210. The output of delay element 210 drives the input of delay element 212. The output of delay element 212 drives output Y 222 and the input of buffer 230, which drives output O 224. Buffer 230 serves to isolate the load capacitance attached to output O 224 from output Y 222, thereby making the overall delay characteristics from input A 220 to output Y 222 more deterministic.

Figure 3A:
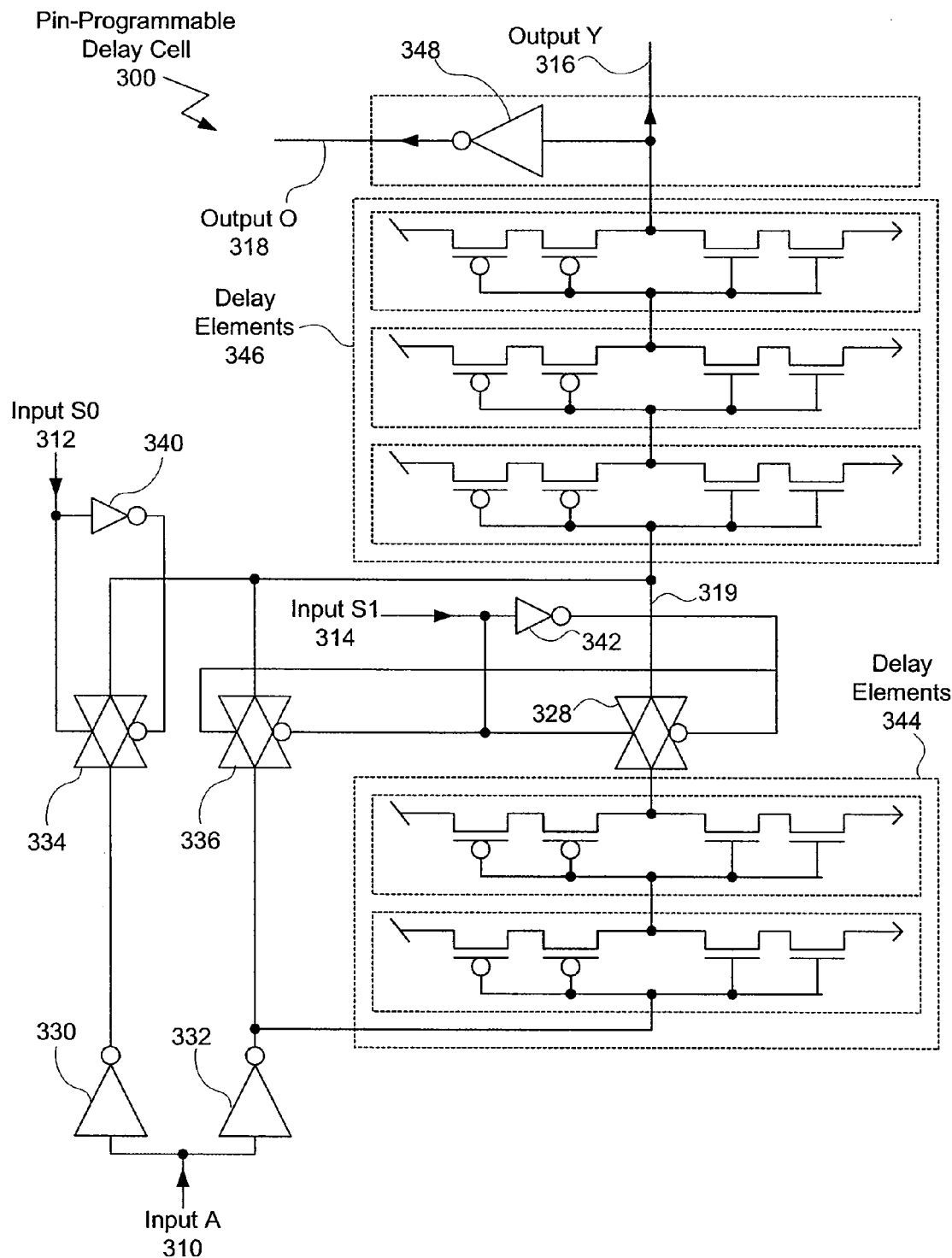
FIG. 3A illustrates the circuit design of a pin-programmable delay cell, according to one embodiment of the invention.

FIG. 3A illustrates the circuit design of a pin-programmable delay cell 300, according to one embodiment of the invention. The pin-programmable delay cell 300 includes input buffers 330 and 332, transmission gates 334, 336 and 328, inverters 340 and 342, delay elements 344 and 346, and output buffer 348. Additionally, the pin-programmable delay cell 300 includes input A 310, output Y 316, output O 318, and two control inputs, input S0 312 and input S1 314.

Delay elements 344 and 346 may include delay elements of the form described in FIGS. 1A through 1E. The specific selection of delay element configuration is based on the specific requirements of the current design. Importantly, the configuration of a given delay element may be changed to a different configuration with a different propagation delay to fine-tune the propagation delay of that delay element using only interconnect layer changes prior to fabrication.

A clock signal enters input A 310 and may take one of three paths to reach node 319. Inputs S0 and S1 collectively determine which path is taken from input A 310 to node 319. From node 319, the clock signal propagates through delay elements 346 before reaching output Y 316. Buffer 348 generates output O 318, a buffered version of the output Y 316. Each of the three paths from input A 310 to node 319 is described in FIGS. 3B to 3D, below.

Figure 3B:
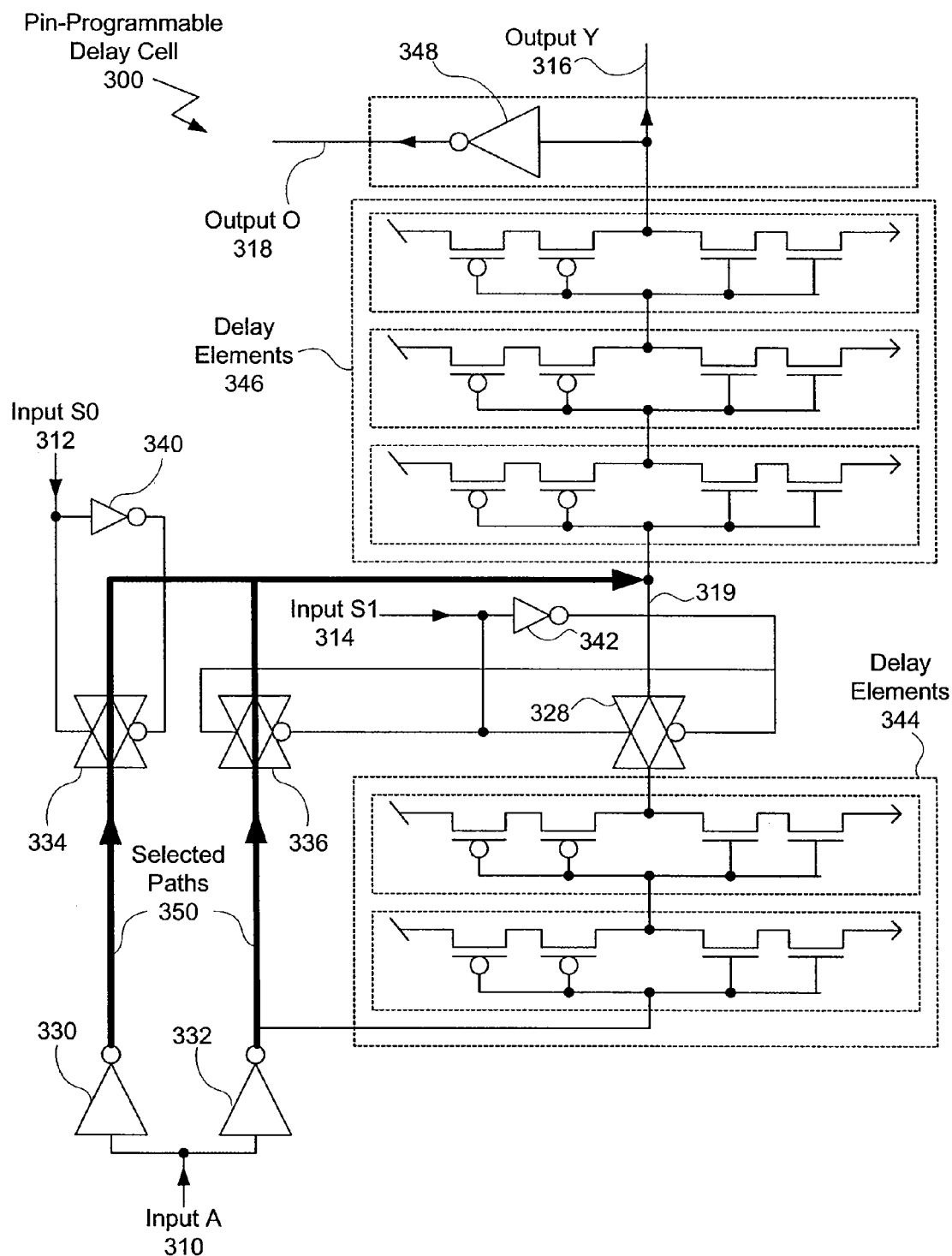
FIGS. 3B to 3D illustrate a clock propagation path through the pin-programmable delay cell of FIG. 3A, according to various embodiments of the invention.
Figure 3C:
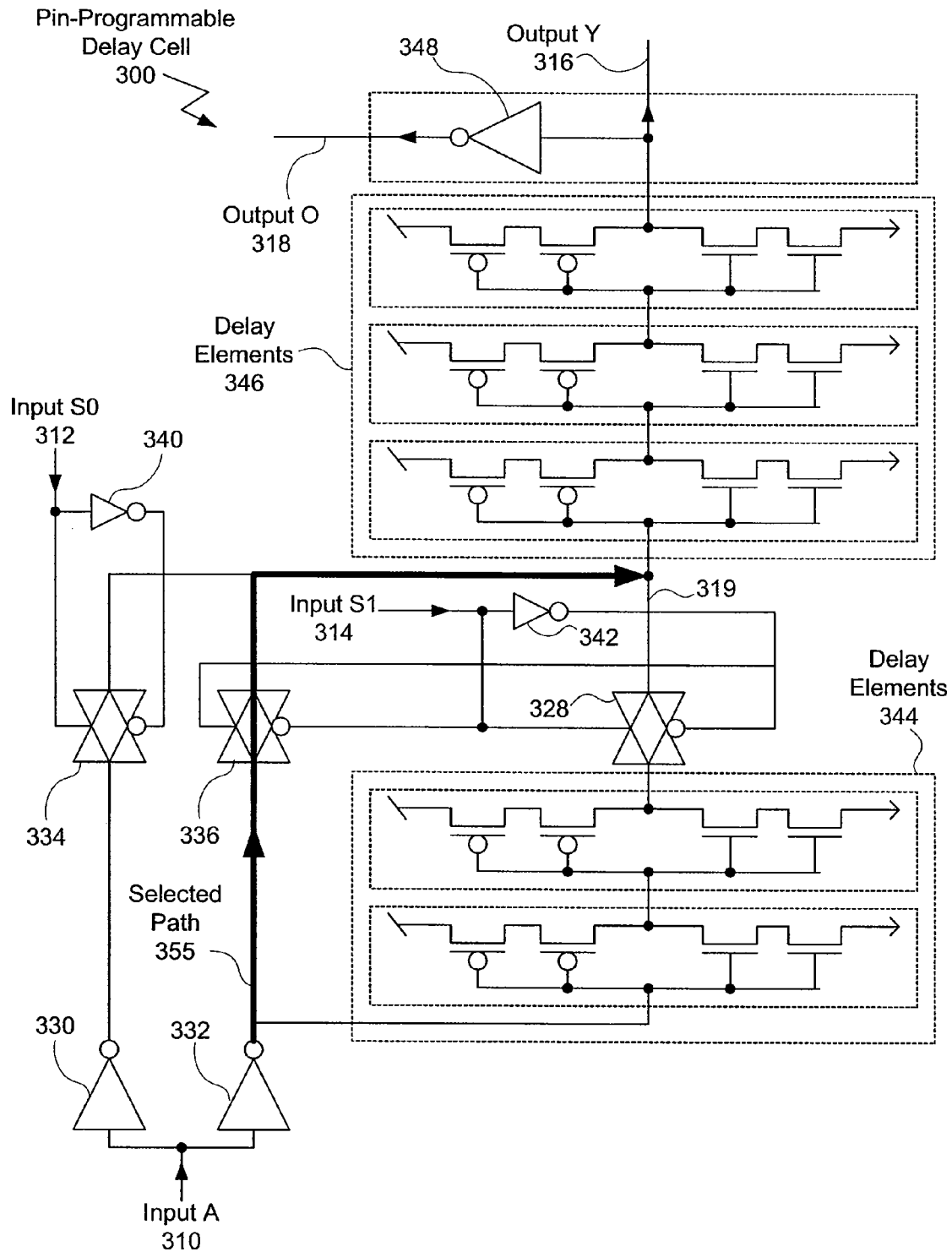
Figure 3D:
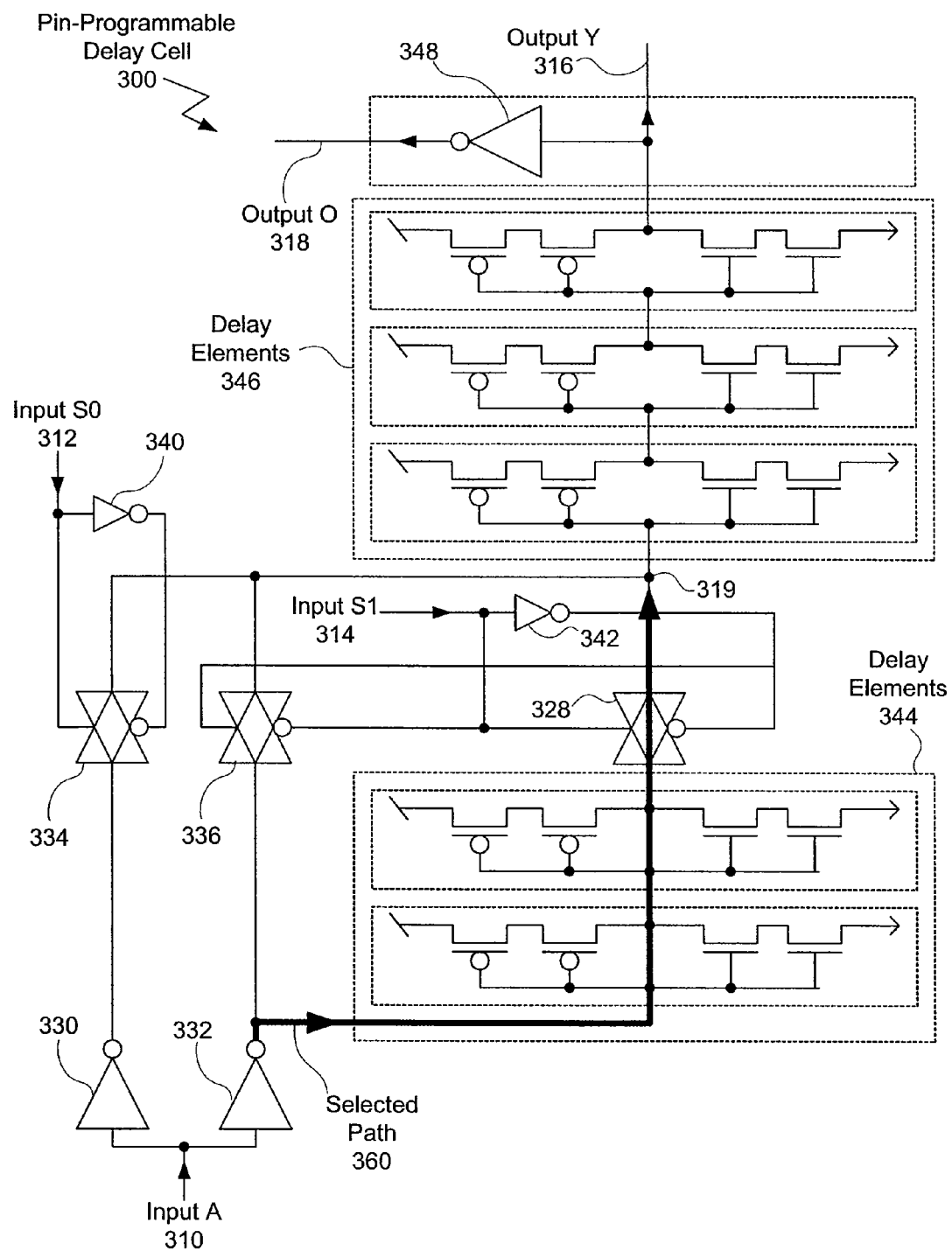

FIGS. 3B to 3D illustrate a clock propagation path through the pin-programmable delay cell of FIG. 3A, according to various embodiments of the invention. In FIG. 3B, input S0 312 is set to "1" and input S1 314 is set to "0." With this set of configuration inputs, transmission gates 334 and 336 close and transmission gate 328 opens. As a result, the selected paths 350 are created from input buffers 330 and 332 to node 319. Selected paths 350 provide the minimum propagation delay from input A 310 to node 319.

In FIG. 3C, input S0 312 is set to "0" and input S1 314 is set to "0." With this set of configuration inputs, transmission gate 336 closes and transmission gates 326 and 328 open. As a result, the selected path 355 is created from input buffer 332 to node 319. Selected path 355 provides approximately half the drive strength used to charge node 319 relative to selected paths 350. Therefore, the propagation delay associated with selected path 355 is longer than the propagation delay associated with selected paths 350.

In FIG. 3D, input S0 312 is set to "0" and input S1 314 is set to "1." With this set of configuration inputs, transmission gates 334 and 336 open and transmission gate 328 closes. As a result, the selected path 360 is created from input buffer 332 to node 319. This path propagates through delay elements 344, thereby introducing additional delay. This additional delay may be useful when debugging an integrated circuit where setup time violations, for example, may be present in client circuits being controlled by the pin-programmable delay cell.

Figure 4A:
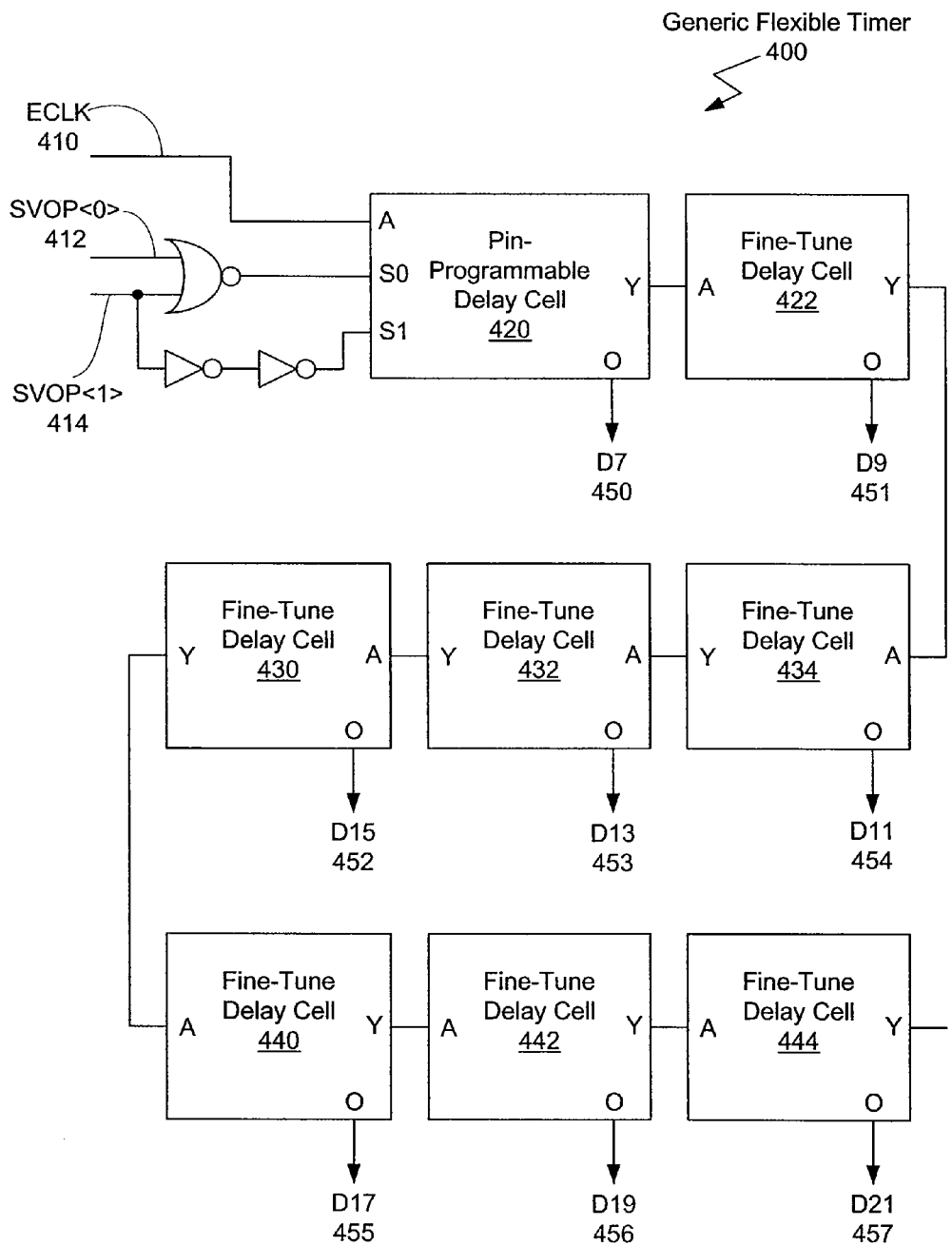
FIG. 4A depicts an exemplary generic flexible timer configuration, according to one embodiment of the invention.

FIG. 4A depicts an exemplary generic flexible timer 400 configuration, according to one embodiment of the invention. The generic flexible timer 400 includes a pin-programmable delay cell 420 and fine-tune delay cells 422, 430, 432, 434, 440, 442 and 444. The pin-programmable delay cell 420, described in FIG. 3A, includes a clock input ECLK 410, and configuration inputs SVOP<0> 412 and SVOP<1> 414, which are processed by input logic to guarantee valid configuration bits presented to the pin-programmable delay cell 420. The buffered output signal of the pin-programmable delay cell 420 provides approximately seven logic delays and corresponds to a first output signal D7 450 of the generic flexible timer 400. The first fine-tune delay cell 422, described in FIG. 2, provides approximately two more logic delays. The buffered output of the first fine-tune delay cell 422 is D9 451. The successive fine-tune delay cells, 434, 432, 430, 440, 442, 444 provide an additional delay of approximately two logic delays each, with a corresponding output D11 454, D13 453, D15 452, D17 455, D19 456 and D21 457, respectively.

The delay cells may be organized in a top-to-bottom serpentine pattern that sweeps left-to-right, then right-to-left. At each delay cell, one buffered output is available along with one cascade output that may be routed to the next cell. One important characteristic of this organization is that all of the inter-cell routing is planar, allowing designers to add or delete delay cells from the chain by changing only one interconnect layer of the overall layout. By including unused "spare" delay cells in the chain, designers may build in significant flexibility for performing flexible timer re-designs involving only one interconnect layer.

Figure 4B:
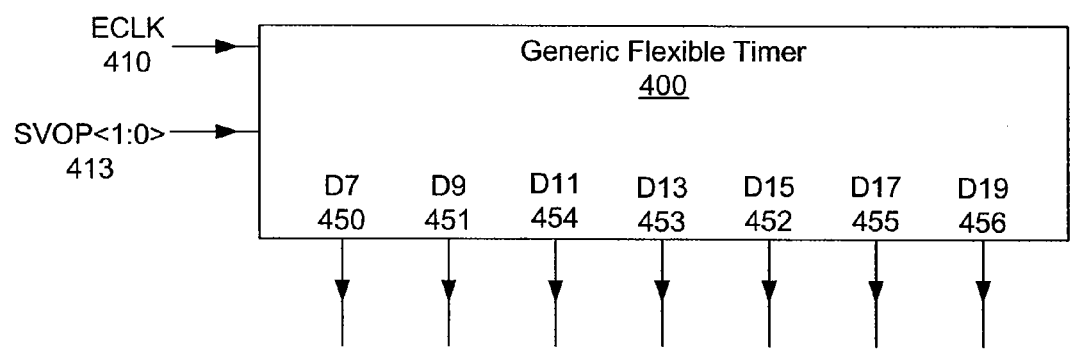
FIG. 4B illustrates an abstracted view of the generic flexible timer of FIG. 4B, according to one embodiment of the invention.

FIG. 4B illustrates an abstracted view of the generic flexible timer 400 of FIG. 4B, according to one embodiment of the invention. The generic flexible timer 400 receives an input clock, ECLK 410 and configuration bits 413, and generates at least one delayed clock signal from ECLK 410. The delayed clock signal outputs are D7 450, D9 451, and so on. Using the delayed clock signals D7 450, D9 451, and so on, clock pulses of controlled width and delay from the reference clock ECLK 410 may be generated, as illustrated below in FIG. 5.

Persons skilled in the art will appreciate that any given generic flexible timer may include one or more pin-programmable delay cells and/or one or more fine-tune delay cells. The embodiment disclosed in FIGS. 4A and 4B is for illustrative purposes only and is in no way meant to limit the scope of the present invention.

Figure 5:
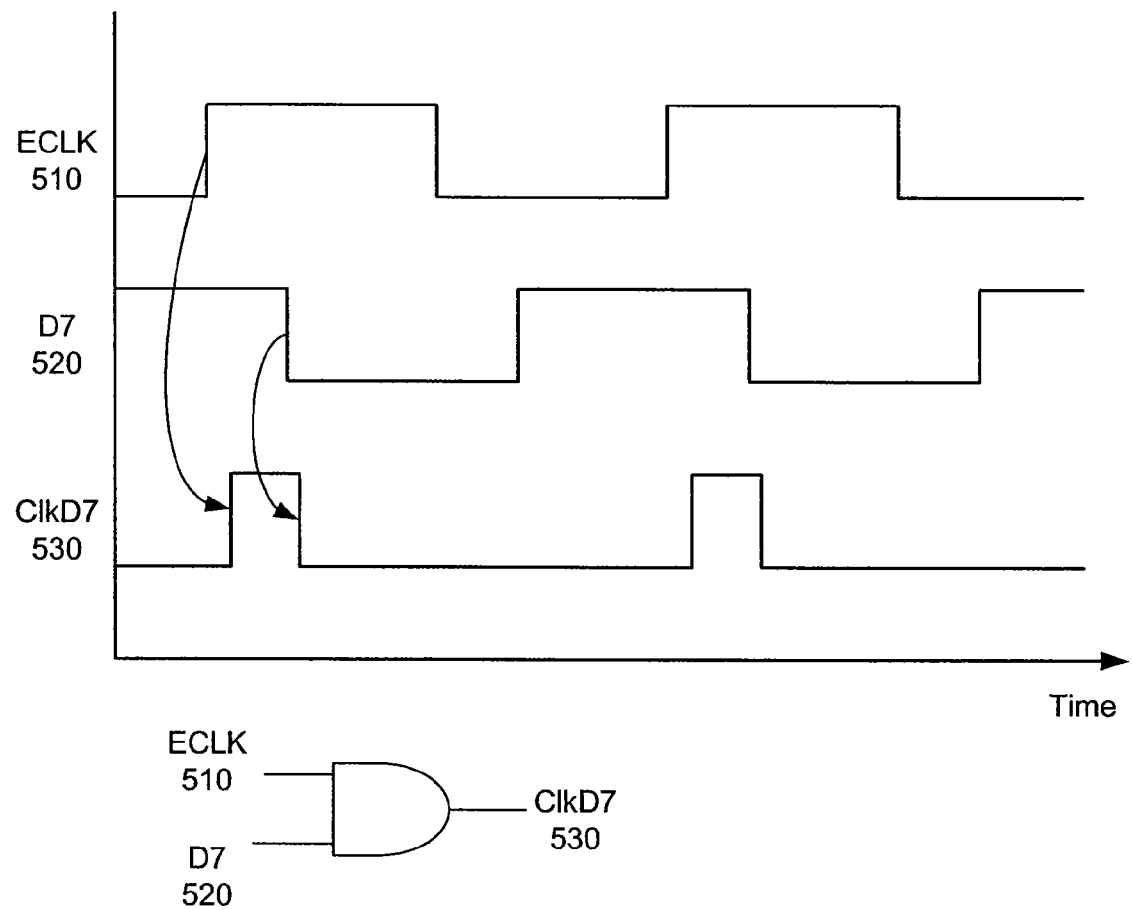
FIG. 5 illustrates the use of a delayed clock signal to derive a timing pulse, according to one embodiment of the invention.

FIG. 5 illustrates the use of a delayed clock signal, D7 520, to derive a timing pulse, ClkD7 530, according to one embodiment of the invention. A clock signal ECLK 510 is combined with the delayed clock signal D7 520 in an AND gate to generate the timing pulse ClkD7 530. Persons skilled in the art will recognize that this technique will produce clean, monotonic pulse edges in the generated timing pulse ClkD7 530.

In FIGS. 6 through 8F, a timer design is described that may be used for controlling a double-pumped SRAM circuit. The timer uses the generic flexible timer delay cells and overall architecture described previously in FIGS. 1A through 5. Six logic circuits, shown in FIGS. 8A-8F generate internal control signals for controlling the SRAM circuit.

Figure 6:
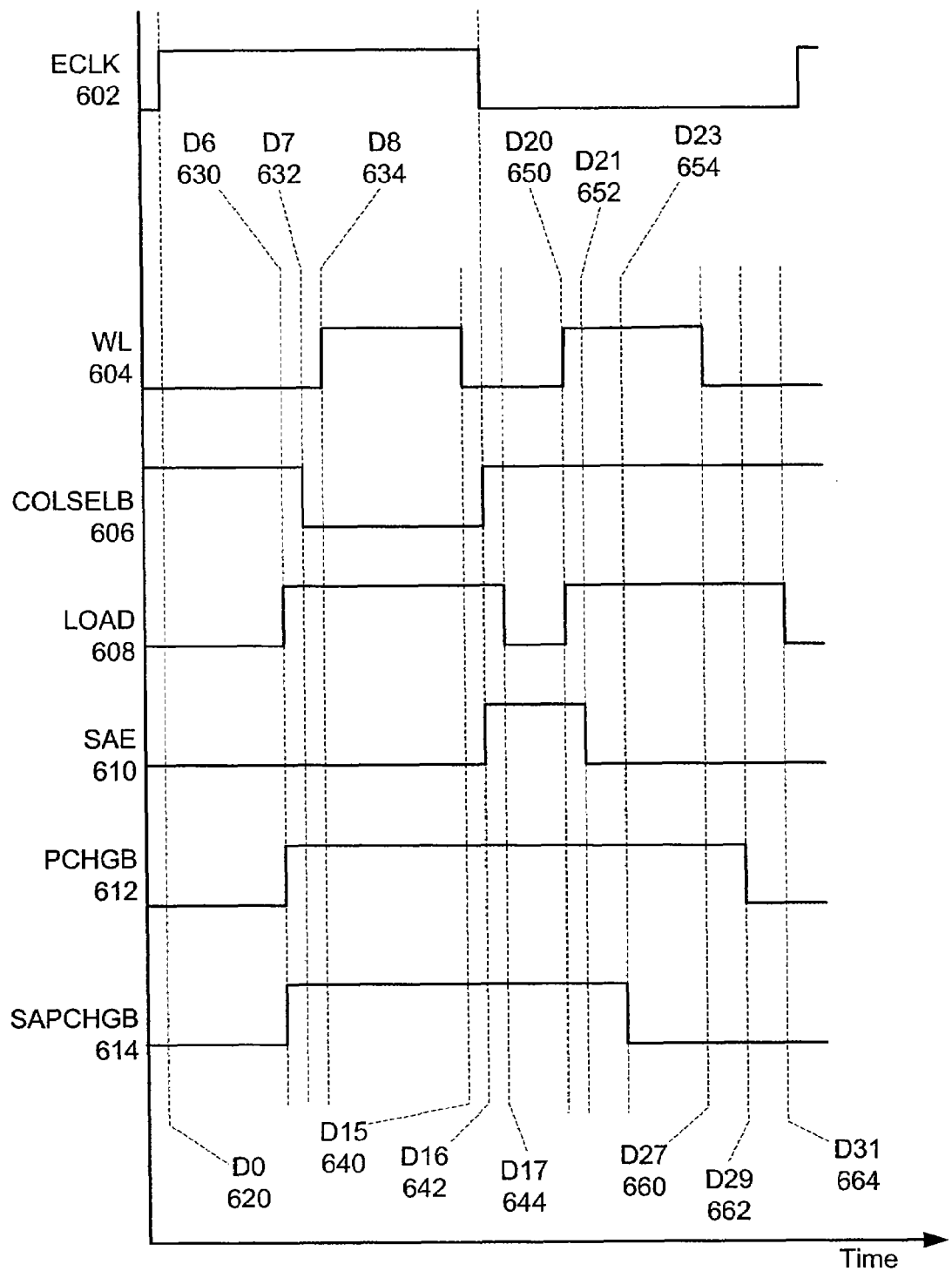
FIG. 6 illustrates the timing of internal control signals within an SRAM circuit, according to one embodiment of the invention.

FIG. 6 illustrates the timing of internal control signals within an SRAM circuit, according to one embodiment of the invention. The internal control signals include a word line (WL) 604, column select bar (COLSELB) 606, load 608, sense amplifier enable (SAE) 610, pre-charge bar (PCHGB) 612, and sense amplifier pre-charge bar (SAPCHGB) 614. The internal control signals should be generated relative to an external clock reference ECLK 602 with a positive edge serving as reference delay zero (D0) 620.

The WL 604 internal control signal may include two pulses within one clock period of ECLK 602. A first pulse on WL 604, referred to as a read word line (RWL) pulse, may be used to perform a read operation. A second pulse on WL 604, referred to as a write word line (WWL) pulse, may be used to perform a write operation. The read pulse on WL 604 is asserted at D8 634 and de-asserted at D15 640. The write pulse on WL 604 is asserted at D20 650 and de-asserted at D27 660.

The COLSELB 606 internal control signal illustrates the timing of one or more column select bits used during a read operation. The one or more COLSELB 606 signals may be used to direct a read column multiplexer (mux) within an SRAM circuit to select one set of bit lines from a plurality of bit lines. For example, if a given internal SRAM structure includes a two-to-one read column mux, then two different COLSELB signals, COLSELB0 and COLSELB1, may be generated and used to control the two-to-one read column mux. The generation and timing of both COLSELB0 and COLSELB1 should be identical. However only one of the two COLSELB signals should be asserted at any one time, according to the value of at least one bit within an associated read address. The COLSELB 606 signal may be active-negative, asserting at D7 632 and de-asserting at D16 642.

The load 608 internal control signal illustrates the timing of one or more load signals within an SRAM circuit. The number of load signals should reflect the multiplexing structure of bit lines within the SRAM circuit. For example, with a two-to-one bit line multiplexing structure, two load signals, LOAD0 and LOAD1, should be generated. The generation and timing of both LOAD0 and LOAD1 should be identical. However, only one of the two load signals should be asserted at any one time, according to the value of at least one bit within an associated read or write address.

Each load 608 signal may pulse up to twice within one clock period of ECLK 602. If a read operation is requested, load 608 asserts at D6 630 and de-asserts at D17 644. If a write operation is requested, load 608 asserts at D20 650 and de-asserts at D31 664.

The SAE 610 internal control signal pulses once within one clock period of ECLK 602. The SAE 610 signal should be asserted at D16 642 and de-asserted at D21 652. The PCHGB 612 internal control signal pulses once within one clock period of ECLK 602. The PCHGB 612 signal should be asserted at D6 630 and de-asserted at D29 622. The SAPCHGB 614 internal control signal pulses once within one clock period of ECLK 602. The SAPCHGB 614 signal should be asserted at D6 630 and re-asserted at D23 654.

Figure 7:
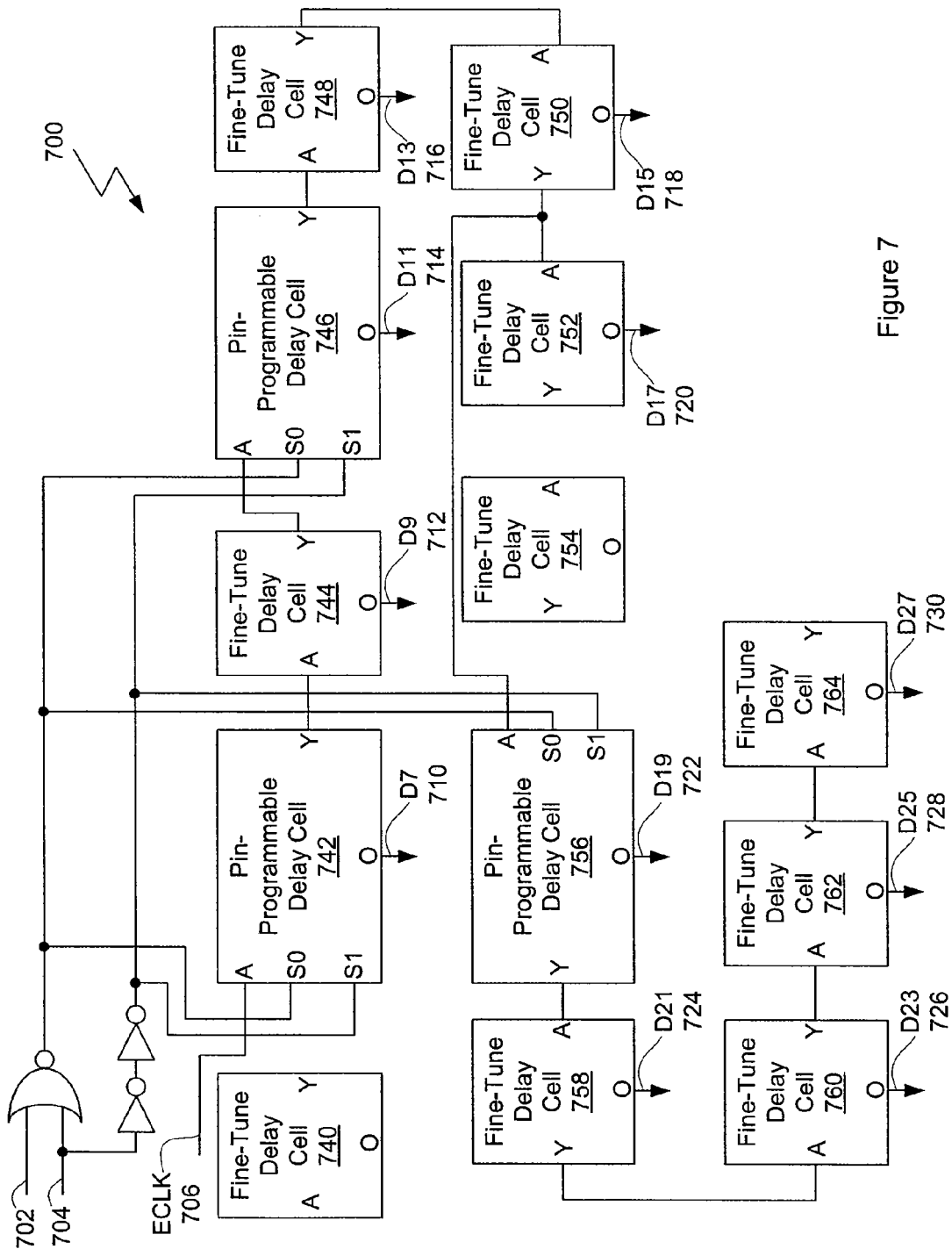
FIG. 7 illustrates a generic flexible timer configured to generate delayed clock signals for use in generating internal control signals within an SRAM circuit, according to one embodiment of the invention.

FIG. 7 illustrates a generic flexible timer 700 configured to generate delayed clock signals for use in generating internal control signals within an SRAM circuit, according to one embodiment of the invention. The generic flexible timer 700 includes three pin-programmable delay cells 742, 746, 756, and eight fine-tune delay cells 744, 748, 750, 752, 758, 760, 762, 764 configured to generated eleven delayed versions of clock ECLK 706 shown as outputs D7 710, D9 712, D11 714, D13 716, D15 718, D17 720, D19 722, D21 724, D23 726, D25 728 and D27 730. The generic flexible timer 700 also includes at least two spare fine-tune delay cells 740, 754, which should be fabricated and made available for incorporation into the generic flexible timer 700 by modifying one interconnect layer. The generic flexible timer 700 also includes configuration inputs 702 and 704, which are processed by input logic to guarantee that valid configuration bits are presented to the pin-programmable delay cells 742, 746, 756.

Persons skilled in the art will recognize that other elements may be added to the basic architecture of FIG. 7 to produce any additional delayed clock signals needed for generating any type of desired control signal for an SRAM device.

The outputs of the generic flexible timer 700 are combined with logic, shown in FIGS. 8A through 8F, to generate the internal control signals 604, 606, 608, 610, 612, 614, illustrated in FIG. 6. In the event one or more of these internal control signals need to be adjusted, the delay cells within the generic flexible timer 700 may be configured, either through configuration inputs 702 and 704, or through tuning individual delay cells, as discussed in FIGS. 2 and 3. Furthermore, the planar organization of the delay cell interconnect facilitates the use of the spare fine-tune delay cells 740 and 754 to introduce additional delay in certain paths. The clock signal ECLK 706 is typically the same signal as the clock signal ECLK 602, shown in FIG. 6.

FIGS. 8A-8F illustrate logic circuits used to generate internal control signals within an SRAM circuit, according to various embodiments of the invention.

Figure 8A:
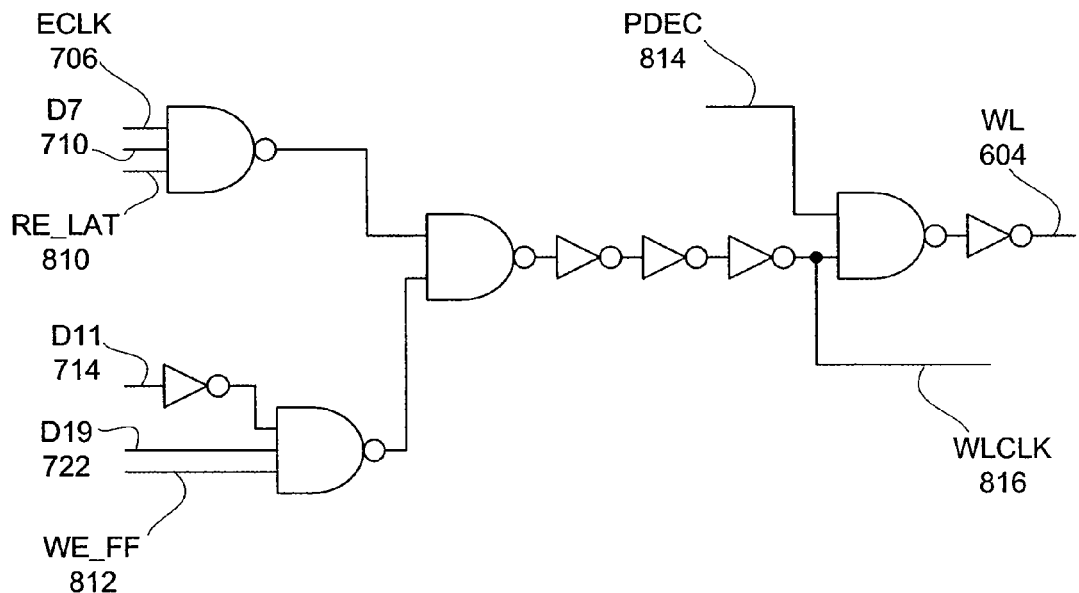
FIGS. 8A-8F illustrate logic circuits used to generate internal control signals within an SRAM circuit, according to various embodiments of the invention.

FIG. 8A illustrates a logic circuit used to generate the WL 604 internal control signal shown in FIG. 6. ECLK 706, D7 710, D11 714 and D19 722 from FIG. 7 are used as inputs along with RE_LAT 810, WE_FF 812 and PDEC 814. RE_LAT 810 is a latched version of a read enable input to the SRAM circuit. WE_FF 812 is the output of a flip-flop that indicates a write enable to the SRAM circuit. PDEC 814 is a pre-decoder output that, when asserted, indicates the word line 604 is to be asserted. An instance of this logic circuit may be used to generate a word line clock (WLCLK) 816.

Figure 8B:
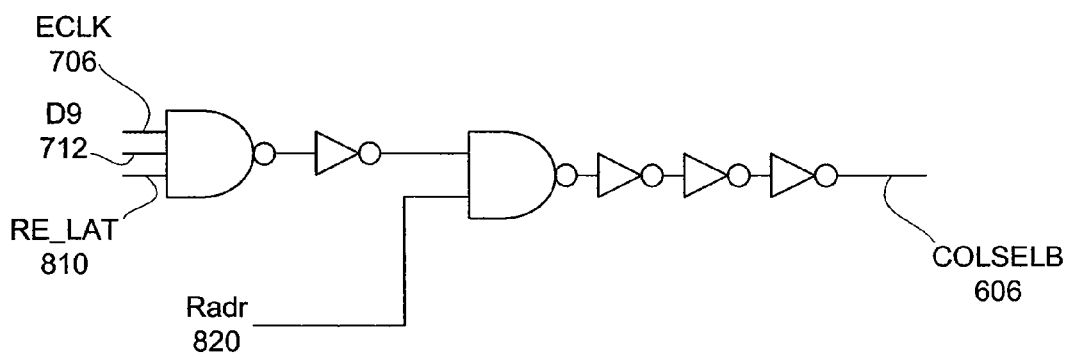

FIG. 8B illustrates a logic circuit used to generate the COLSELB 606 internal control signal shown in FIG. 6. One or more instance of this circuit is used to generate one or more COLSELB signals, where only one of the COLSELB signals are asserted at any one time, according to a read address input to the SRAM. ECLK 706 and D9 712 from FIG. 7 are used as inputs along with RE_LAY 810 and Radr 820. As discussed previously, RE_LAT 810 is a latched version of a read enable input to the SRAM circuit. The Radr 820 signal may be an address bit from the SRAM read address input signal. Alternately, Radr 820 may be one bit of a decoded version of the SRAM read address input signal.

Figure 8C:
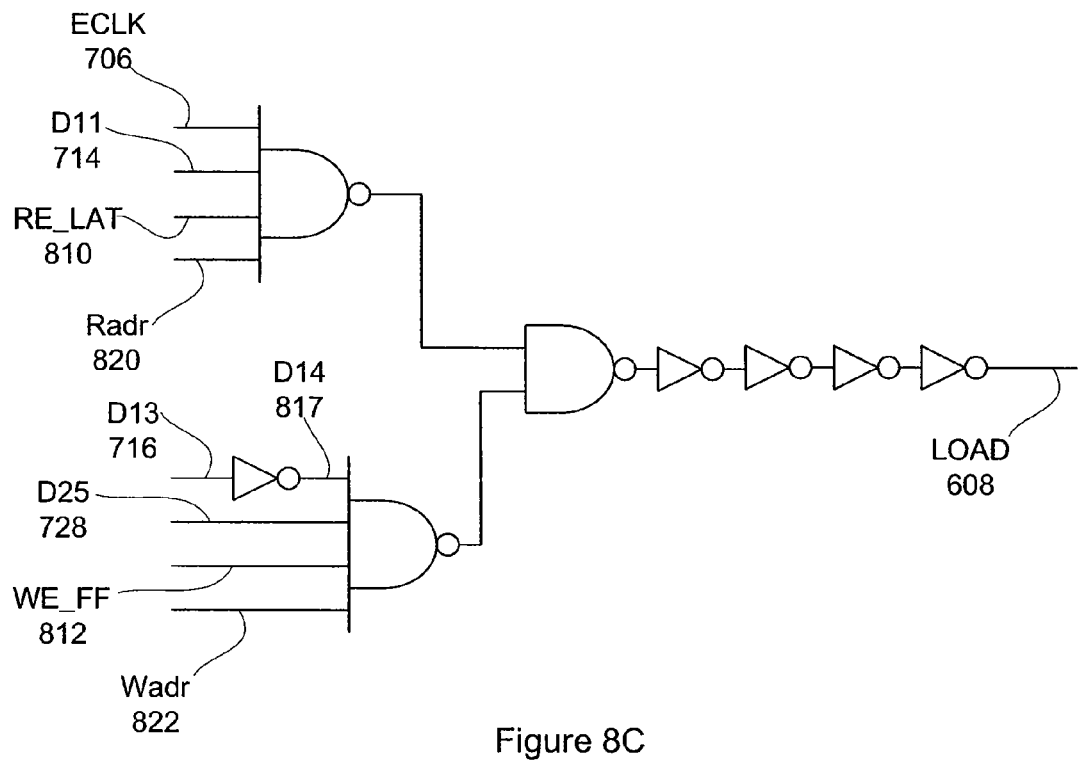

FIG. 8C illustrates a logic circuit used to generate the LOAD 608 internal control signal shown in FIG. 6. Previously discussed signals, including ECLK 706, D11 714, RE_LAT 810, Radr 820, D13 716, D25 728, WE_FF 812, are used as inputs. Additionally, Wadr 822 is also used as an input. Wadr 822 is typically identical in function to Radr 820, except Wadr 822 corresponds to an SRAM write address input signal. D14 817 is generated using an inverter delay.

Figure 8D:
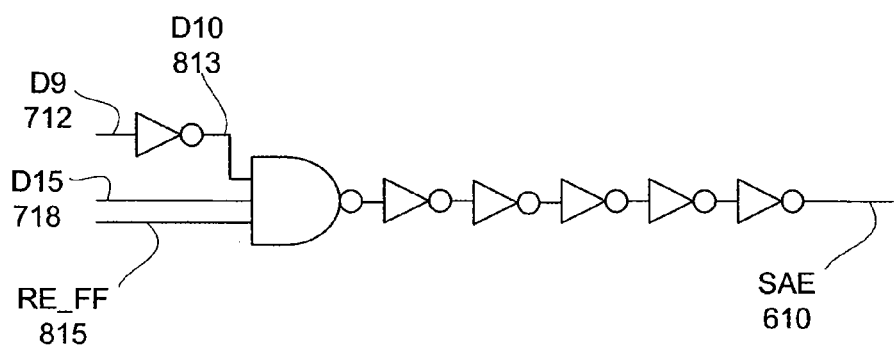

FIG. 8D illustrates a logic circuit used to generate the SAE 610 internal control signal shown in FIG. 6. Previously discussed signals, including D9 712, RE_LAT 810, Radr 820, and D15 718 are used as inputs. Additionally, RE_FF 815, a read enable to the SRAM circuit from a flip-flop, is also used as an input. D10 813 is generated using an inverter delay.

Figure 8E:
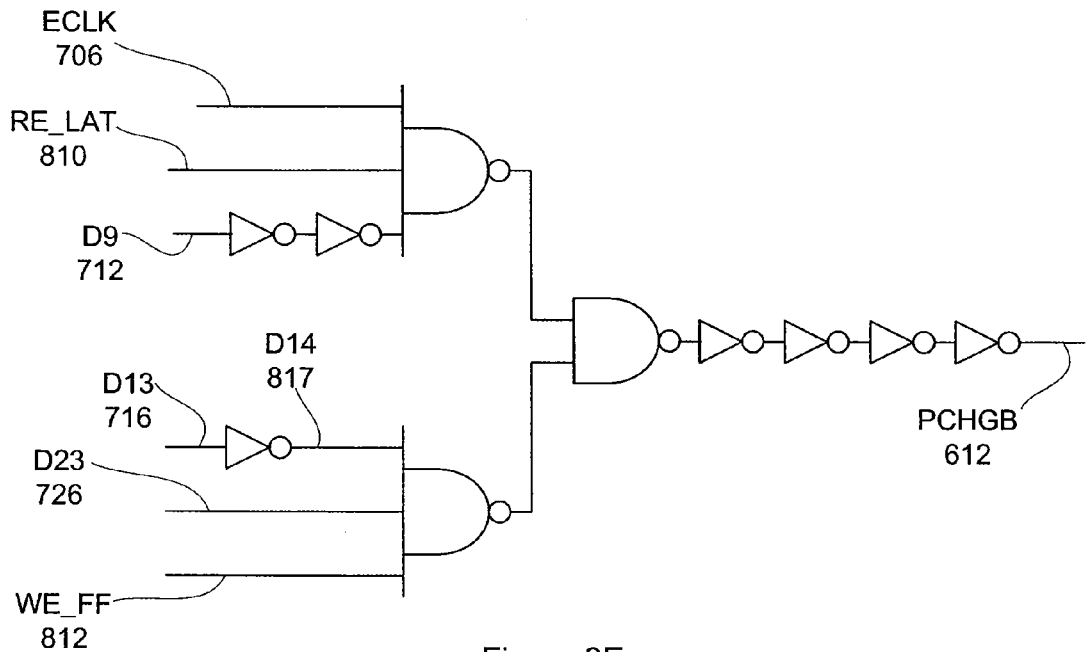

FIG. 8E illustrates a logic circuit used to generate the PCHGB 612 internal control signal shown in FIG. 6. Previously discussed signals, including ECLK 706, RE_LAT 810, D9 712, D13 716, D23 726, and WE_FF 812 are used as inputs. D14 817 is generated using an inverter delay.

Figure 8F:
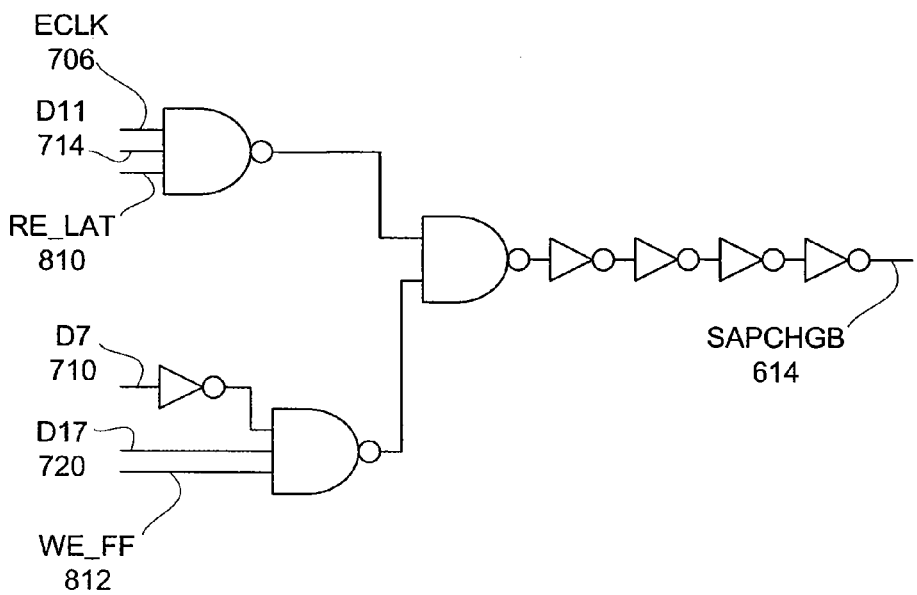

FIG. 8F illustrates a logic circuit used to generate the SAPCHGB 614 internal control signal shown in FIG. 6. Previously discussed signals, including ECLK 706, D11 714, RE_LAT 810, D7 710, D17 720, and WE_FF 812 are used as inputs.

Figure 9:
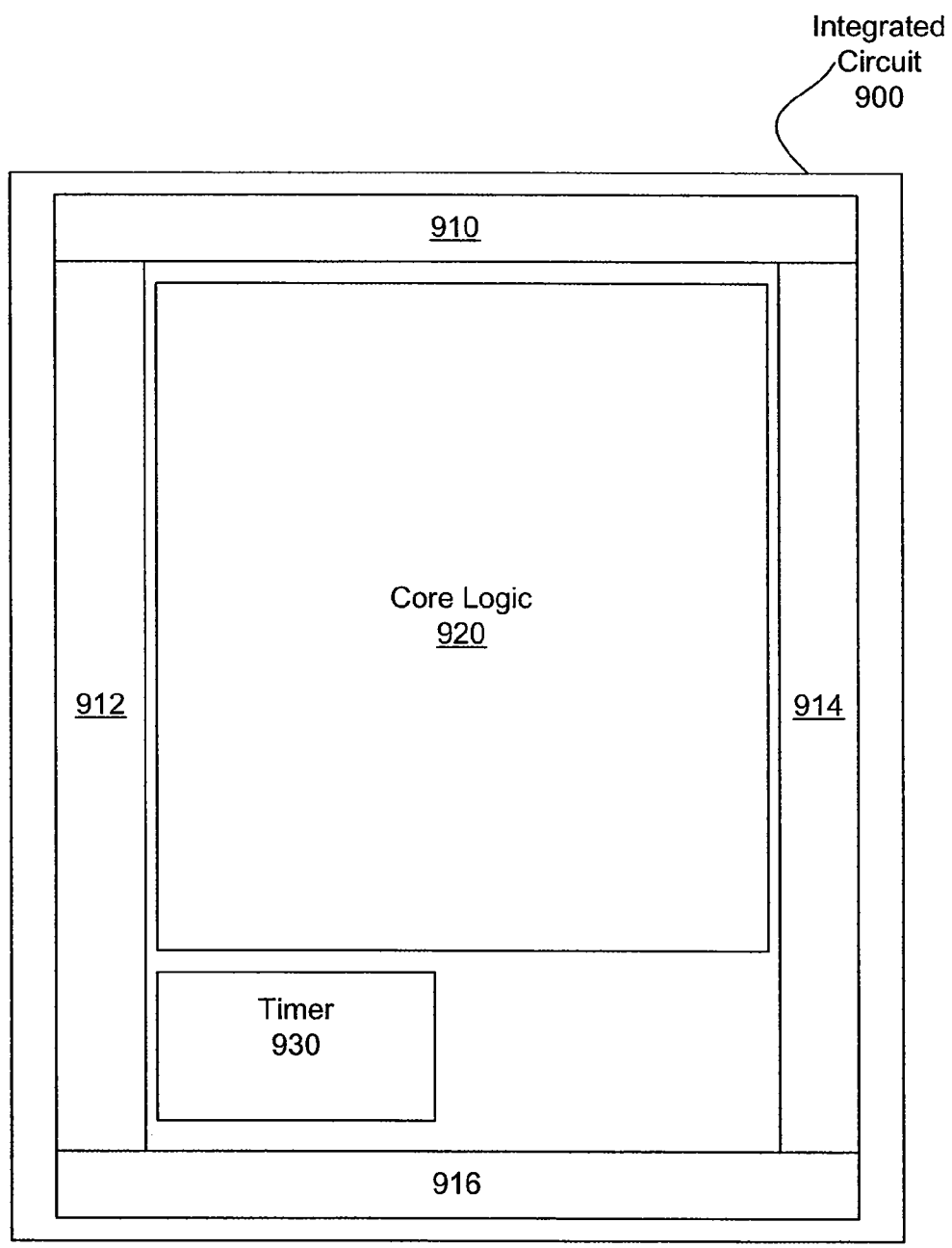
FIG. 9 depicts an integrated circuit in which one or more aspects of the invention may be implemented.

FIG. 9 depicts an integrated circuit 900 in which one or more aspects of the invention may be implemented. The integrated circuit 900 includes input/output circuits 910, 912, 914 and 916, as well as core logic 920. The integrated circuit 900 also includes at least one timer 930. The timer 930 includes any combination of pin-programmable delay cells and fine-tune delay cells, shown in FIGS. 3 and 2, respectively. The timer 930 is used to generate internal control signals for controlling the activity of circuitry within the integrated circuit 900.

Figure 10:
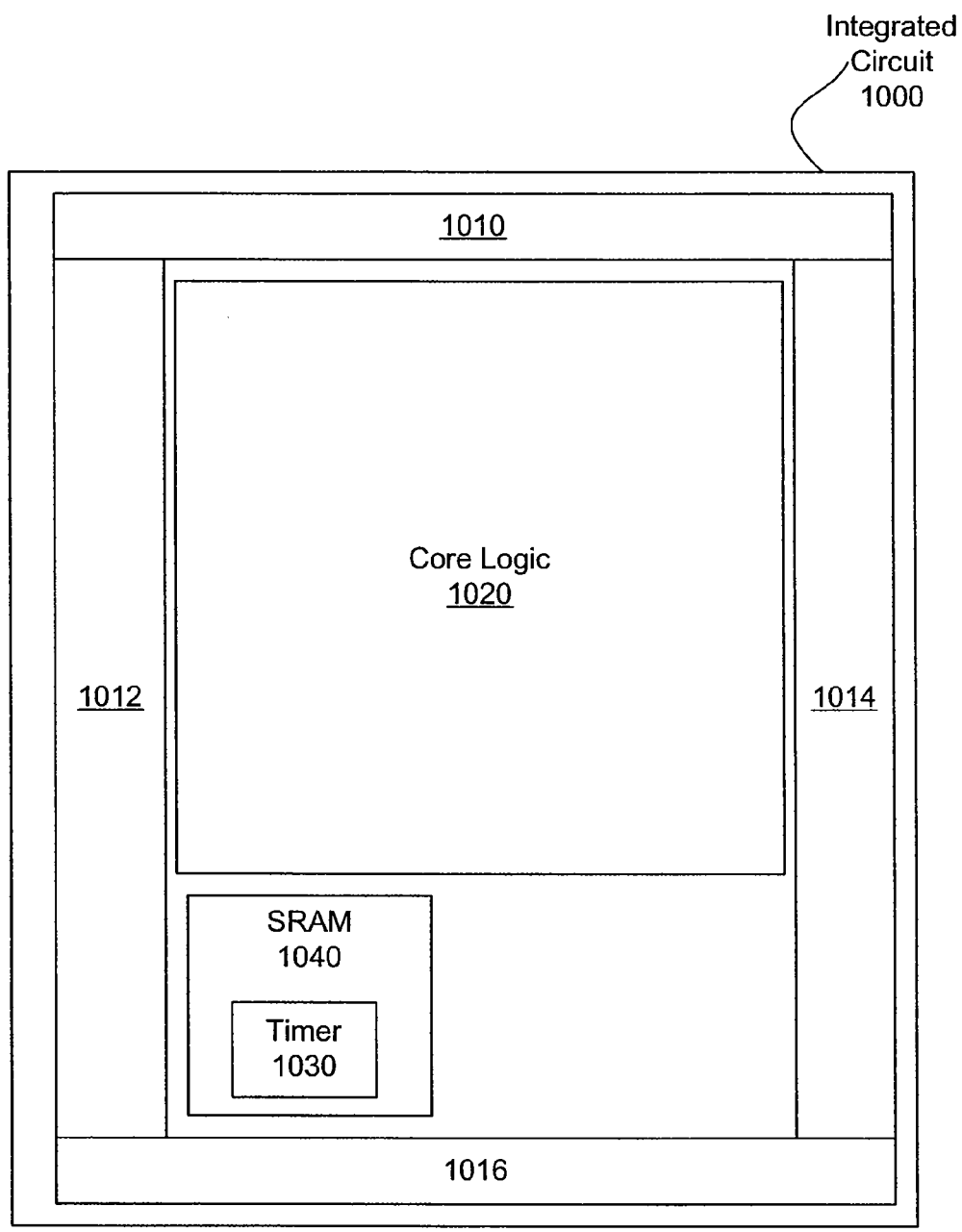
FIG. 10 depicts an integrated circuit including an SRAM circuit in which one or more aspects of the invention may be implemented.

FIG. 10 depicts an integrated circuit 1000 including an SRAM circuit in which one or more aspects of the invention may be implemented. The integrated circuit 1000 includes input/output circuits 1010, 1012, 1014 and 1016, as well as core logic 1020. The integrated circuit 1000 also includes at least one timer 1030. The timer 1030 includes any combination of pin-programmable delay cells and fine-tune delay cells, shown in FIGS. 3 and 2, respectively. The timer 1030 is used to generate internal control signals for controlling the function and timing of the SRAM 1040 within the integrated circuit 1000.

In sum, three building blocks are introduced that facilitate the design of timer circuits. The first building block is a delay element that includes four transistors, allowing the delay element to be customized, using a single metal layer, to one of five configurations. The second building block is a fine-tune delay cell that includes two delay elements and an output buffer. The third building block is a pin-programmable delay cell that includes multiple delay elements, each of which may be customized using a single metal layer. The timing characteristics of the pin-programmable delay cell may also be customized in a life circuit using a set of input control signals. The fine-tune delay cell and the pin-programmable delay cell may be combined to form a generic flexible timer used to control various integrated circuits, such as embedded SRAM modules. The overall structure of the generic flexible timer reduces the effort needed to achieve a high-quality design and introduces a number of cost-effective alternatives in the event of a design error.

While the forgoing is directed to embodiments of the present invention, other and further embodiments of the invention may be devised without departing from the basic scope thereof. For example, aspects of the present invention may be implemented in hardware or software or in a combination of hardware and software. Therefore, the scope of the present invention is determined by the claims that follow.

We claim:

1. A pin-programmable delay cell, comprising:
   an input channel through which an input signal is transmitted;
   a first control input channel through which a first control signal is transmitted for controlling a first transmission gate;
   a second control input channel through which a second control signal is transmitted for controlling a second transmission gate and a third transmission gate,
      wherein, when the first transmission gate and the second transmission gate are closed and the third transmission gate is opened, the input signal is transmitted through the first transmission gate and the second transmission gate in parallel;
   a first set of delay elements disposed between the input channel and the third transmission gate, wherein each delay element may be reconfigured with a single interconnect layer change;
   a second set of delay elements, wherein:
      each delay element may be reconfigured with a single interconnect layer change,
      the first transmission gate, the second transmission gate and the third transmission gate are disposed between the first set of delay elements and the second set of delay elements,
      the input channel is coupled to an input of the first transmission gate and to an input of the second transmission gate, and
      an output of the first transmission gate and an output of the second transmission gate are coupled to the second set of delay elements; and
   a first output channel through which a first output signal is transmitted.

2. The pin-programmable delay cell of claim 1, wherein the first control signal and the second control signal configure the first transmission gate, the second transmission gate and the third transmission gate such that input signal may take one of three paths to the second set of delay elements.

3. The pin-programmable delay cell of claim 2, wherein the first control signal and the second control signal configure the first transmission gate, the second transmission gate and the third transmission gate such that the input signal is transmitted through the first transmission gate, the second transmission gate and the second set of delay elements, but not the first set of delay elements or the third transmission gate, wherein the input signal is transmitted through the first transmission gate and the second transmission gate in parallel.

4. The pin-programmable delay cell of claim 2, wherein the first control signal and the second control signal configure the first transmission gate, the second transmission gate and the third transmission gate such that the input signal is transmitted through the second transmission gate and the second set of delay elements, but not the first set of delay elements, the first transmission gate or the third transmission gate.

5. The pin-programmable delay cell of claim 2, wherein the first control signal and the second control signal configure the first transmission gate, the second transmission gate and the third transmission gate such that the input signal is transmitted through the first set of delay elements, the third transmission gate and the second set of delay elements, but not the first transmission gate or the second transmission gate.

6. The pin-programmable delay cell of claim 2, wherein the propagation delay associated with the third path is greater than the propagation delay associated with the second path, and the propagation delay associated with the second path is greater than the propagation delay associated with the first path.

7. The pin-programmable delay cell of claim 1, further comprising a second output channel through which a buffered output is transmitted, wherein an output buffer is disposed between the first output channel and the second output channel to isolate any load capacitance coupled to the second output channel from the first output channel.

8. The pin-programmable delay cell of claim 1, further comprising an inverter configured to invert the second control signal and coupled to the third transmission gate such that the control signal received by the third transmission gate is inverted relative to the control signal received by the second transmission gate.

9. A generic flexible timer, comprising:
   a pin-programmable delay cell that includes:
      an input channel through which an input signal is transmitted,
      a first control input channel through which a first control signal is transmitted for controlling a first transmission gate,
      a second control input channel through which a second control signal is transmitted for controlling a second transmission gate and a third transmission gate,
         wherein, when the first transmission gate and the second transmission gate are closed and the third transmission gate is opened, the input signal is transmitted through the first transmission gate and the second transmission gate in parallel,
      a first set of delay elements disposed between the input channel and the third transmission gate, wherein each delay element may be reconfigured with a single interconnect layer change,
      a second set of delay elements, wherein:
         each delay element may be reconfigured with a single interconnect layer change,
         the first transmission gate, the second transmission gate and the third transmission gate are disposed between the first set of delay elements and the second set of delay elements, the input channel is coupled to an input of the first transmission gate and to an input of the second transmission gate, and an output of the first transmission gate and an output of the second transmission gate are coupled to the second set of delay elements, two output channels, wherein an unbuffered output signal is transmitted through a first output channel of the two output channels and a buffered output signal is transmitted through a second output channel of the two output channels; and at least one fine-tune delay cell coupled to the pin-programmable delay cell, wherein each fine-tuned delay cell includes:

an input channel through which an input signal is received and transmitted, a first delay element coupled to the input channel, a second delay element coupled to the first delay element, wherein each of the first delay element and the second delay element may be reconfigured with a single interconnect layer change, an output driver coupled to the second delay element, an output channel through which an output signal is transmitted, and a buffered output channel through which a buffered output signal is transmitted.

10. The generic flexible timer of claim 9, wherein a reference clock signal is received and transmitted through the first input channel, and at least the buffered output signal from the pin-programmable delay cell or the buffered output signal from the fine-tune delay cell is combined with the reference clock signal to produce clock pulses of controlled width and delay.

11. The generic flexible timer of claim 9, wherein the at least one fine-tune delay cell comprises a first fine-tune delay cell that produces a first buffered output signal, a second fine-tune delay cell that produces a second buffered output signal, and a third fine-tune delay cell that produces a third buffered output signal, and wherein the buffered output signal from the pin-programmable delay cell is delayed relative to a reference clock signal by a first number of logic delays, the first buffered output signal is delayed relative to the buffered output signal from the pin-programmable delay cell by two logic delays, the second buffered output signal is delayed relative to the first buffered output signal by two logic delays, and the third buffered output signal is delayed relative to the second buffered output signal by two logic delays.

12. The generic flexible timer of claim 11, wherein at least the buffered output signal from the pin-programmable delay cell, the first buffered output signal, the second buffered output signal, or the third buffered output signal is combined with the reference clock signal to produce clock pulses of controlled width and delay.

13. The generic flexible timer of claim 9, wherein the at least one fine-tune delay cell comprises a first fine-tune delay cell that produces a first buffered output signal, a second fine-tune delay cell that produces a second buffered output signal, a third fine-tune delay cell that produces a third buffered output signal, a fourth fine-tune delay cell that produces a fourth buffered output signal, and a fifth fine-tune delay cell that produces a fifth buffered output signal, and wherein the buffered output signal from the pin-programmable delay cell is delayed relative to a reference clock signal by a first number of logic delays, the first buffered output signal is delayed relative to the buffered output signal from the pin-programmable delay cell by two logic delays, the second buffered output signal is delayed relative to the first buffered output signal by two logic delays, the third buffered output signal is delayed relative to the second buffered output signal by two logic delays, the fourth buffered output signal is delayed relative to the third buffered output signal by two logic delays, and the fifth buffered output signal is delayed relative to the fourth buffered output signal by two logic delays.

14. The generic flexible time of claim 13, wherein at least the buffered output signal from the pin-programmable delay cell, the first buffered output signal, the second buffered output signal, the third buffered output signal, the fourth buffered output signal, or the fifth buffered output signal is combined with the reference clock signal to produce clock pulses of controlled width and delay.

15. The generic flexible timer of claim 9, wherein the at least one fine-tune delay cell comprises a first fine-tune delay cell that produces a first buffered output signal, a second fine-tune delay cell that produces a second buffered output signal, a third fine-tune delay cell that produces a third buffered output signal, a fourth fine-tune delay cell that produces a fourth buffered output signal, a fifth fine-tune delay cell that produces a fifth buffered output signal, a sixth fine-tune delay cell that produces a sixth buffered output signal, and a seventh fine-tune delay cell that produces a seventh buffered output signal, and wherein the buffered output signal from the pin-programmable delay cell is delayed relative to a reference clock signal by a first number of logic delays, the first buffered output signal is delayed relative to the buffered output signal from the pin-programmable delay cell by two logic delays, the second buffered output signal is delayed relative to the first buffered output signal by two logic delays, the third buffered output signal is delayed relative to the second buffered output signal by two logic delays, the fourth buffered output signal is delayed relative to the third buffered output signal by two logic delays, the fifth buffered output signal is delayed relative to the fourth buffered output signal by two logic delays, the sixth buffered output signal is delayed relative to the fifth buffered output signal by two logic delays, and the seventh buffered output signal is delayed relative to the sixth buffered output signal by two logic delays.

16. The generic flexible time of claim 15, wherein at least the buffered output signal from the pin-programmable delay cell, the first buffered output signal, the second buffered output signal, the third buffered output signal, the fourth buffered output signal, the fifth buffered output signal, the sixth buffered output signal, or the seventh buffered output signal is combined with the reference clock signal to produce clock pulses of controlled width and delay.

17. An integrated circuit, comprising:

a plurality of input/output circuits;

core logic; and a timer coupled to the core logic, the timer including:

a pin-programmable delay cell that includes:

an input channel through which an input signal is transmitted, a first control input channel through which a first control signal is transmitted for controlling a first transmission gate, a second control input channel through which a second control signal is transmitted for controlling a second transmission gate and a third transmission gate, wherein, when the first transmission gate and the second transmission gate are closed and the third transmission gate is opened, the input signal is transmitted through the first transmission gate and the second transmission gate in parallel, a first set of delay elements disposed between the input channel and the third transmission gate, wherein each delay element may be reconfigured with a single interconnect layer change, a second set of delay elements, wherein each delay element may be reconfigured with a single interconnect layer change, and the first transmission gate, the second transmission gate and the third transmission gate are disposed between the first set of delay elements and the second set of delay elements, two output channels, wherein an unbuffered output signal is transmitted through a first output channel of the two output channels and a buffered output signal is transmitted through a second output channel of the two output channels, and at least one fine-tune delay cell coupled to the pin-programmable delay cell, wherein each fine-tuned delay cell includes:

an input channel through which an input signal is received and transmitted, a first delay element coupled to the input channel, a second delay element coupled to the first delay element, wherein each of the first delay element and the second delay element may be reconfigured with a single interconnect layer change, an output driver coupled to the second delay element, an output channel through which an output signal is transmitted, and a buffered output channel through which a buffered output signal is transmitted.

18. The integrated circuit of claim 17, wherein a reference clock signal is received and transmitted through the first input channel, and at least the buffered output signal from the pin-programmable delay cell or the buffered output signal from the fine-tune delay cell is combined with the reference clock signal to produce clock pulses of controlled width and delay.

19. The integrated circuit of claim 17, wherein the at least one fine-tune delay cell comprises a first fine-tune delay cell that produces a first buffered output signal, a second fine-tune delay cell that produces a second buffered output signal, and a third fine-tune delay cell that produces a third buffered output signal, and wherein the buffered output signal from the pin-programmable delay cell is delayed relative to a reference clock signal, the first buffered output signal is delayed relative to the buffered output signal from the pin-programmable delay cell, the second buffered output signal is delayed relative to the first buffered output signal, and the third buffered output signal is delayed relative to the second buffered output signal.

20. The integrated circuit of claim 19, wherein at least the buffered output signal from the pin-programmable delay cell, the first buffered output signal, the second buffered output signal, or the third buffered output signal is combined with the reference clock signal to produce clock pulses of controlled width and delay.

* * * * *